United States Patent
Okano

(10) Patent No.: US 8,063,692 B2
(45) Date of Patent: Nov. 22, 2011

(54) SEMICONDUCTOR INTEGRATED CIRCUIT

(75) Inventor: Hiroshi Okano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/813,360

(22) Filed: Jun. 10, 2010

(65) Prior Publication Data
US 2010/0244942 A1  Sep. 30, 2010

Related U.S. Application Data

(63) Continuation of application No. PCT/JP2007/074144, filed on Dec. 14, 2007.

(51) Int. Cl.
*G05F 1/10* (2006.01)

(52) U.S. Cl. ........................ 327/534; 327/544

(58) Field of Classification Search .................. 327/530, 327/534, 535, 537, 544
See application file for complete search history.

(56) References Cited

U.S. PATENT DOCUMENTS

| | | | |
|---|---|---|---|
| 6,433,584 B1 * | 8/2002 | Hatae | 326/80 |
| 6,774,705 B2 * | 8/2004 | Miyazaki et al. | 327/534 |
| 7,417,489 B2 * | 8/2008 | Fujita et al. | 327/534 |
| 2001/0048319 A1 | 12/2001 | Miyazaki et al. | |
| 2001/0052800 A1 | 12/2001 | Mizuno | |

FOREIGN PATENT DOCUMENTS

| | | |
|---|---|---|
| JP | 2001-345693 A | 12/2001 |
| JP | 2002-076873 A | 3/2002 |
| JP | 2005-182433 A | 7/2005 |
| JP | 2007-264726 A | 10/2007 |

* cited by examiner

*Primary Examiner* — Jeffrey Zweizig
(74) *Attorney, Agent, or Firm* — Arent Fox LLP

(57) ABSTRACT

A semiconductor integrated circuit includes: an internal circuit; a detecting circuit which detects an element characteristic of the internal circuit; a calculating circuit which calculates a first consumption energy consumed when a power gating operation is performed on a task processed by the internal circuit and a second consumption energy consumed when an operation of reducing a voltage and a frequency is performed in accordance with the element characteristic; and a switching circuit which performs the power gating operation on the internal circuit when the first consumption energy is smaller than the second consumption energy and performs the operation of reducing a voltage and a frequency when the second consumption energy is smaller than the first consumption energy.

12 Claims, 16 Drawing Sheets

FIG. 3A

| Oscillation Frequency Code FCODE | Process Size Variation Code PCODE |
|---|---|
| 83 ~ 80 | 7 |
| 79 ~ 76 | 6 |
| 75 ~ 72 | 5 |
| 71 ~ 68 | 4 |
| 67 ~ 65 | 3 |
| 64 ~ 62 | 2 |
| 61 ~ 60 | 1 |
| 59 ~ 58 | 0 |

FIG. 3B

Conversion Table for PCODE = 7

| Oscillation Frequency Code FCODE | Temperature Code TCODE |
|---|---|
| 99 ~ 96 | 7 |
| 95 ~ 92 | 6 |
| 91 ~ 88 | 5 |
| 87 ~ 84 | 4 |
| 83 ~ 80 | 3 |
| 79 ~ 76 | 2 |
| 75 ~ 72 | 1 |
| 71 ~ 68 | 0 |

⋮

Conversion Table for PCODE = 0

| Oscillation Frequency Code FCODE | Temperature Code TCODE |
|---|---|
| 67 ~ 66 | 7 |
| 65 ~ 64 | 6 |
| 63 ~ 62 | 5 |
| 61 ~ 60 | 4 |
| 59 ~ 58 | 3 |
| 57 ~ 56 | 2 |
| 55 ~ 54 | 1 |
| 53 ~ 52 | 0 |

FIG. 5

| | Operation Frequency | | Power Supply | | WCET | Activation Rate |
|---|---|---|---|---|---|---|
| | DVFS | PG | DVFS | PG | | |
| Task1 | F1 | F2 | Vdd1 | Vdd2 | WCET1 | A1 |
| Task2 | F3 | F4 | Vdd3 | Vdd4 | WCET2 | A2 |
| ••• | ••• | ••• | ••• | ••• | ••• | ••• |

FIG. 6

| Temperature | Leakage Current |
|---|---|
| T1 | Ileak1 |
| T2 | Ileak2 |
| T3 | Ileak3 |
| T4 | Ileak4 |

FIG. 12

| Process size variation code | Leakage Current |
|---|---|
| P1 | Ileak1 |
| P2 | Ileak2 |
| P3 | Ileak3 |
| P4 | Ileak4 |

FIG. 14

| Temperature | Process Size Variation code | Leakage Current |
|---|---|---|
| T1 | P1 | Ileak11 |
|    | P2 | Ileak12 |
|    | P3 | Ileak13 |
|    | P4 | Ileak14 |
| T2 | P1 | Ileak21 |
|    | P2 | Ileak22 |
|    | P3 | Ileak23 |
|    | P4 | Ileak24 |
| T3 | P1 | Ileak31 |
|    | P2 | Ileak32 |
|    | P3 | Ileak33 |
|    | P4 | Ileak34 |
| T4 | P1 | Ileak41 |
|    | P2 | Ileak42 |
|    | P3 | Ileak43 |
|    | P4 | Ileak44 |

SEMICONDUCTOR INTEGRATED CIRCUIT

CROSS REFERENCE TO RELATED APPLICATION

This is a continuation of Application PCT/JP2007/074144 filed on Dec. 14, 2007, the entire contents of which are incorporated herein by reference.

FIELD

The embodiments discussed herein are related a semiconductor integrated circuit including a circuit function of controlling an operation state of an internal circuit so that power consumption is reduced.

BACKGROUND

As semiconductor elements have been miniaturized, distances between sources and drains of MOS transistors are reduced and leakage currents between the sources and the drains are increased. The leakage currents are increased in an exponential manner along with increase of operation temperatures of the MOS transistors. The leakage currents are further increased when a threshold value is lowered owing to fabrication variations of the MOS transistors. Therefore, in semiconductor integrated circuits including the MOS transistors, power consumptions are increased owing to increase of the leakage currents.

Accordingly, in micro processors, for example, a method, which is referred to as a Dynamic Voltage and Frequency Scaling (DVFS) method, for reducing a power consumption using a circuit function of changing a power-supply voltage of an internal circuit or a frequency of an operation clock in accordance with a processing load has been employed.

Furthermore, in mobile devices, a method, which is referred to as a Power Gating) (PG method, for reducing a power consumption by stopping power supplied to an internal circuit while the internal circuit is in a standby state has been employed.

According to the DVFS method, an operation current and a leakage current per unit time may be reduced by controlling an operation frequency or an operation voltage of a task having long Worst Case Execution Time (WCET) so that operation periods of circuits are matched with one another. For example, Japanese Laid-open Patent Application Publication No. 2001-345693 discloses a semiconductor integrated circuit device capable of controlling a clock control circuit and a power-supply voltage control circuit in accordance with requisite performance so as to realize a low power consumption.

On the other hand, according to the PG method, although the operation current and the leakage current while the circuits operate are not reduced, a leakage current while the circuits do not operate in the WCET is reduced.

As described above, in terms of the reduction of the power consumption, one of the DVFS method and the PG method has been used depending on an operation of a circuit included in a semiconductor integrated circuit device and a state of a WCET associated with the circuit operation. However, superiority of the DVFS method or the PG method in a certain semiconductor integrated circuit device may depend on an operation temperature condition and a fabrication condition of the semiconductor integrated circuit device.

SUMMARY

Accordingly, it is an object of the present invention to provide a semiconductor integrated circuit device which has a function of changing an operation frequency and a operation voltage of an internal circuit and a function of performing stop and disconnection of power supply and which employs one of a DVFS method and a PG method which is determined to be advantageous.

To address the problem described above, the present invention provides a semiconductor integrated circuit including a detecting circuit which detects an element characteristic, a calculating circuit which calculates a first consumption energy consumed when a power gating operation is performed on a task processed by the internal circuit and a second consumption energy consumed when an operation of reducing a voltage and a frequency is performed in accordance with the element characteristic, and a switching circuit which activates a first circuit which performs the power gating operation on the internal circuit when the first consumption energy is smaller than the second consumption energy and activates a second circuit which performs the operation of reducing a voltage and a frequency when the second consumption energy is smaller than the first consumption energy.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIGS. 3A and 3B are conversion tables used when a process size variation code [2:0] of three bits and a temperature code [2:0] of three bits are to be output using an oscillation frequency code [7:0] of seven bits as an input;

FIG. 5 is a table illustrating power-supply voltages, operation frequencies, activation rates, and WCETs for individual tasks used to calculate a consumption energy when the PG method or the DVFS method is executed;

FIG. 6 is a table illustrating leakage currents (Ileak) of the switching circuit relative to various temperatures which are used to calculate a consumption energy when the PG method or the DVFS method is executed;

FIG. 12 is a table illustrating leakage currents (Ileak) of circuits relative to various process size variation codes which is used to calculate a consumption energy when the PG method or the DVFS method is executed;

FIG. 14 is a table illustrating leakage currents (Ileak) of a circuit relative to various temperature codes and various process size variation codes which are used to calculate a consumption energy when the PG method or the DVFS method is executed;

DESCRIPTION OF EMBODIMENTS

Hereinafter, first to fourth embodiments of the present invention will be described. Note that the present invention is not limited to these embodiments.

A semiconductor integrated circuit 100 according to a first embodiment includes a circuit which measures a temperature, a circuit which calculates a first consumption energy when a PG method is employed and a second consumption energy when a DVFS method is employed while a task is executed by an internal circuit using the temperature, and a changing circuit which activates a circuit for realizing the PG method when the first consumption energy is smaller than the second consumption energy and activates a circuit for realizing the DVFS method when the second consumption energy is smaller than the first consumption energy.

Figure 1:
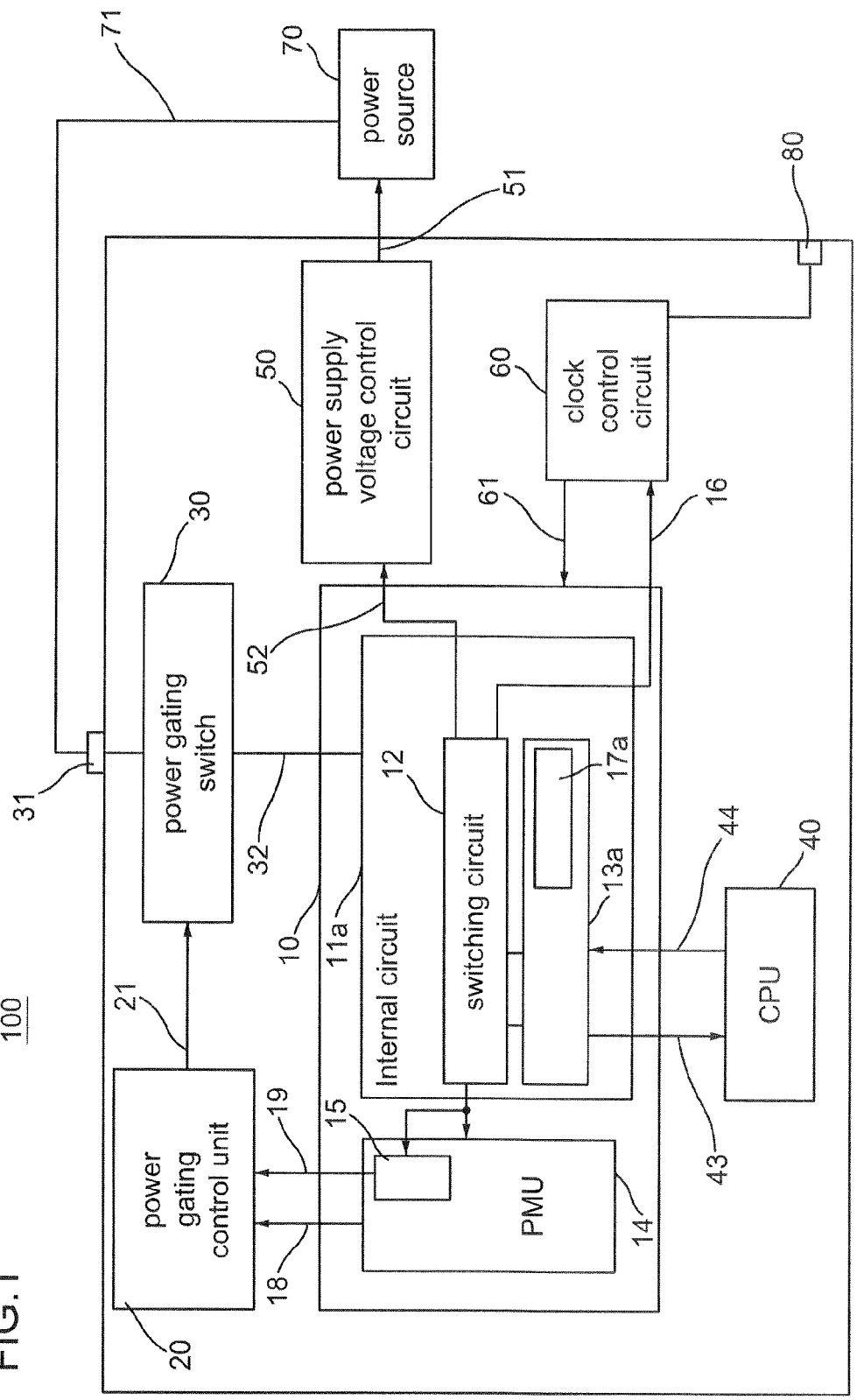
FIG. 1 illustrates a semiconductor integrated circuit and a power source according to a first embodiment.

FIG. 1 illustrates the semiconductor integrated circuit 100 and a power source 70 according to the first embodiment. The semiconductor integrated circuit 100 includes a CPU 10, a power gating control circuit 20, a power gating switch 30, a temperature sensor 40, a power-supply-voltage control circuit 50, a clock control circuit 60, an external clock-signal terminal 80, and a power-supply terminal 31.

The semiconductor integrated circuit 100 operates when receiving a power-supply voltage from the power source 70 supplied in accordance with a power-supply-voltage changing instruction signal 51 transmitted from the power-supply-voltage control circuit 50. Note that the power-supply-voltage changing instruction signal 51 is a code signal, for example. Furthermore, the power-supply voltage is supplied through an external power source line Vdd 71.

The power-supply-voltage control circuit 50 generates the power-supply-voltage changing instruction signal 51 to be supplied to the power source 70 when receiving a power-supply-voltage changing instruction signal 52 supplied from a switching circuit 12. Since the power-supply-voltage changing instruction signals 51 and 52 are code signals, the power-supply-voltage control circuit 50 is configured as a normal cord conversion circuit.

The clock control circuit 60 receives a clock-frequency changing instruction signal 16 supplied from the CPU 10 and changes a frequency of a clock signal 61 generated in accordance with an external clock signal so that the frequency is lowered. Note that the external clock signal is supplied to the clock control circuit 60 through the external clock-signal terminal 80.

The temperature sensor 40 receives a temperature measuring instruction signal 43 supplied from the CPU 10 and outputs a temperature measuring result 44. Note that the temperature sensor 40 will be described in detail hereinafter with reference to FIG. 3.

The power gating switch 30 has one terminal to which a power-supply voltage is to be supplied through the external power source line Vdd 71 and the power-supply terminal 31. The power gating switch 30 has the other terminal connected to an internal circuit 11a of the CPU 10. The power gating switch 30 performs an on or off operation in accordance with a logic of a control signal 21 supplied from the power gating control circuit 20. Accordingly, the power gating switch 30 has a function of connecting the power-supply terminal 31 to and disconnecting the power-supply terminal 31 from the internal circuit 11a. For example, a MOS transistor having a large driving capacity may be employed as the power gating switch 30.

The power gating control circuit 20 generates the control signal 21 when receiving an instruction signal 18 supplied from a PMU (Power Managing Unit) 14 of the CPU 10.

When a plurality of internal circuits 11a are included in the CPU 10, a plurality of power gating switches 30 are provided for the internal circuits 11a and a plurality of power gating control circuits 20 are also provided for the internal circuits 11a. In this case, the instruction signal 18 is a code signal, for example. Furthermore, the power gating control circuit 20 may include a decoding circuit which determines whether to be selected in response to the instruction signal 18, for example, and an amplifying circuit which amplifies a signal generated by the decoding circuit.

The CPU 10 includes the internal circuit 11a and the PMU 14. The internal circuit 11a includes the switching circuit 12, a consumption energy calculating circuit 13a, and a storage unit 17a.

The consumption energy calculating circuit 13a outputs the temperature measuring instruction 43 to the temperature sensor 40 so as to obtain the temperature measuring result 44. Then, the consumption energy calculating circuit 13a calculates a consumption energy consumed by the internal circuit 11a using Expression (1) below when the PG method is employed. Furthermore, the consumption energy calculating circuit 13a calculates a consumption energy consumed by the internal circuit 11a using Expression (2) below on the basis of the temperature measuring result 44 when the DVFS method is employed. When the consumption energy calculating circuit 13a received a result obtainment signal from the switching circuit 12 and the consumption energy calculated using Expression (1) is larger than the consumption energy calculated using Expression (2), the consumption energy calculating circuit 13a outputs a result notification signal of a logic "H" and otherwise outputs a result notification signal of a logic "L".

$$E = C \times A \times Vdd1^2 \times f1 \times (f2/f1) \times \text{WCET} + I\text{leak} \times Vdd1 \times (f2/f1) \times \text{WCET} \qquad \text{Expression (1)}$$

$$E = C \times A \times Vdd2^2 \times f2 \times \text{WCET} + I\text{leak} \times Vdd2 \times \text{WCET} \qquad \text{Expression (2)}$$

Note that a general consumption energy is represented by Expression (3).

$$E = P \times T = C \times A \times Vdd^2 \times f \times T + I\text{leak} \times Vdd \times T \qquad \text{Expression (3)}$$

Therefore, when the PG method is employed, "T=(f2/f1)× WCET" is satisfied whereas when the DVFS method is employed, "T=WCET" is satisfied. Accordingly, Expressions (1) and (2) are obtained.

Here, "C" denotes a load capacity of the internal circuit 11a, and "A" denotes an activation rate determined for each task. Furthermore, "Vdd1" and "f1" denote an operation voltage used to operate the internal circuit 11a and a clock frequency assigned to the internal circuit 11a for a certain task, respectively, when the PG method is employed. Similarly, "Vdd2" and "f2" denote an operation voltage used to operate the internal circuit 11a and a clock frequency assigned to the internal circuit 11a for a certain task, respectively, when the DVFS method is employed.

Moreover, "WCET" denotes a worst case execution time set for each task, and "Ileak" denote a leakage current of the internal circuit 11a included in the CPU 10 set for each task. Note that "Ileak" is set on the basis of the temperature measuring result 44.

Then, the consumption energy calculating circuit 13a stores a table including values f1, Vdd1, f2, Vdd2, WCET, and A, and a table including values Ileak corresponding to temperature cords in the storage unit 17a included in the consumption energy calculating circuit 13a. Furthermore, the storage unit 17a included in the consumption energy calculating circuit 13a stores a cord conversion table which will be described with reference to FIG. 3A.

Then, the consumption energy calculating circuit 13a obtains a value Ileak corresponding to a certain temperature code as follows.

First, when an operation test of the semiconductor integrated circuit 100 according to the first embodiment is to be performed, the consumption energy calculating circuit 13a obtains a PCODE (process size variation code) from the temperature measuring result 44, i.e., a FCODE, obtained by operating the temperature sensor 40 while a temperature is fixed using the code conversion table. Then, the consumption energy calculating circuit 13a stores the obtained PCODE in the storage unit 17a.

At a time of normal operation, the consumption energy calculating circuit 13a obtains a temperature code using the temperature measuring result 44 and one of conversion tables (which include the relationships between the FCODEs and TCODEs and which will be described hereinafter with reference to FIG. 3B) corresponding to the PCODE. Thereafter, the consumption energy calculating circuit 13a obtains a value Ileak using a table of values Ileak corresponding to the temperature code.

The switching circuit 12 outputs the result obtainment signal to the consumption energy calculating circuit 13a and receives the result notification signal from the consumption energy calculating circuit 13a. When the result notification signal has a logic "L", the switching circuit 12 outputs a signal to the PMU 14 so that the PG method is employed for the internal circuit 11a and outputs the power-supply-voltage changing instruction signal 52 and the clock-frequency changing instruction signal 16 to the power-supply-voltage control circuit 50 and the clock control circuit 60, respectively, so that the DVFS method is not employed.

On the other hand, when the result notification signal has a logic "H", the switching circuit 12 outputs a signal to the PMU 14 so that the PG method is not employed for the internal circuit 11a and outputs the power-supply-voltage changing instruction signal 52 and the clock-frequency changing instruction signal 16 to the power-supply-voltage control circuit 50 and the clock control circuit 60, respectively, so that the DVFS method is employed.

The PMU 14 receives a signal supplied from the switching circuit 12 and outputs a signal for controlling the power gating control circuit 20 in accordance with a logic of the signal. A process of the control will be described hereinafter when the power gating control circuit 20 is described in detail.

The PMU 14 includes a restoring circuit 15. When a predetermined period of time has elapsed after an electric power supplied to the internal circuit 11a is stopped in the PG method, the restoring circuit 15 outputs a signal to the power gating control circuit 20 so that the power supply to the internal circuit 11a is started again. Note that the predetermined period of time is measured by a normal timer circuit included in the restoring circuit 15. Furthermore, the predetermined period of time may be set for each task when the restoring circuit 15 received the signal supplied from the switching circuit 12. In this case, the signal supplied from the switching circuit 12 is a cord signal and the restoring circuit 15 includes a timer circuit which measures time in accordance with the received code signal.

The power gating control circuit 20 outputs a control signal so as to control on and off states of the power gating switch 30 when receiving the power gating instruction signal 18 or a restoration signal 19 supplied from the PMU 14. Specifically, the power gating control circuit 20 includes an RS flip-flop circuit which receives the power gating instruction signal 18 as a first input and the restoration signal 19 as a second input and outputs the control signal 21.

Here, in response to the signal supplied from the switching circuit 12, the PMU 14 receives the WCET for a task to be performed and information representing that power gating is to be performed on the task. Furthermore, when operation of the internal circuit 11a is to be terminated after the task is started, the PMU 14 normally outputs a pulse as the power gating instruction signal 18 so that a logic "L" state is changed to a logic "H" state. Thereafter, the predetermined period of time is measured by the timer circuit included in the restoring circuit 15 and the restoring circuit 15 normally outputs a pulse as the restoration signal 19 so that the logic "H" state is changed to the logic "L" state. Note that the PMU 14 preferably recognizes a timing when the operation of the internal circuit 11a is terminated by receiving an operation termination signal representing that the operation of the internal circuit 11a has been terminated supplied from the switching circuit 12. However, the PMU 14 may recognize the timing when the operation of the internal circuit 11a is terminated when the number of clocks counted using signals transmitted from the switching circuit 12 for each task has reached a predetermined count value.

Then, in a period after the pulse of the power gating instruction signal 18 is generated and before the pulse of the restoration signal 19 is generated, the control signal 21 is in the logic "H" state. Furthermore, in a period after the pulse of the restoration signal 19 is generated and before a pulse of the next power gating instruction signal 18 is generated, the control signal 21 is in the logic "L" state. In accordance with the logic of the control signal 21, the power gating switch 30 is turned on or off.

The power gating switch 30 has one terminal connected to a power-supply line connected to the power-supply terminal 31 and the other terminal connected to a virtual Vdd 32 serving as an internal power-supply line. The power gating switch 30 connects the power-supply line connected to the power-supply terminal 31 to or disconnects the power-supply line connected to the power-supply terminal 31 from the virtual Vdd 32. The power gating switch 30 may be constituted by a MOS transistor having a high driving capability, for example. Specifically, since the control signal 21 is in the logic "L" state when the operation of the internal circuit 11a is terminated, an N-type MOS transistor is preferable employed as the power gating switch 30. However, a P-type MOS transistor may be employed on condition that an inversion signal of the control signal 21 is used for controlling the power gating switch 30.

The temperature sensor 40 will be described with reference to FIGS. 2A and 2B. The temperature sensor 40 illustrated in FIG. 2A includes a ring oscillator unit 41 and a clock counting unit 42.

In circuits included in the temperature sensor 40, signals rocs_en and count_en are supplied from the consumption energy calculating circuit 13a. The signal rocs_en is an enable signal of a clock signal clk. The signal count_en instructs a start of counting. The clock signal clk may be an external clock signal supplied from the external clock-signal terminal 80 or may be the clock signal 61 supplied from the clock control circuit 60.

The ring oscillator unit 41 includes a flip-flop circuit 41a, an NAND circuit 41b, inverters 41c, 41d, 41e, 41f, and 41g, a flip-flop circuit 41h, and an inverter 41i, and outputs a signal rocs_clk. Among these components, the flip-flop circuit 41a and the inverters 41c, 41d, 41e, and 41f constitute a ring oscillator and the flip-flop circuit 41h and the inverter 41i constitute a ½ frequency divider.

As an element of the ring oscillator unit 41, a Low-Vth transistor is used. A process size variation of the Low-Vth transistor affects a frequency of the signal rocs_clk. The ring oscillator unit 41 oscillates while the signal rocs_en is in a logic "1" state among a plurality of periods of the clock signal clk. In this case, an oscillation frequency is determined by delay times of the components included in the ring oscillator unit 41.

The clock counting unit 42 includes flip-flop circuits 42a, 42b, 42c, 42d, 42g, and 42i, AND circuits 42e and 42f, and an incrementing unit 42h and outputs a signal FCODE. The clock counting unit 42 counts the number of times the clock signal rocs_clk is toggled in a period in which the signal count_en is in the logic "1" state among the plurality of periods of the clock signal clk. Since a signal asynchronous transfer is requested between the flip-flop circuit 42i driven by the clock signal clk and the flip-flop circuit 42d driven by the clock signal rocs_clk, the clock counting unit 42 includes a metastable addressing circuit constituted by the AND circuit 42f, the flip-flop circuit 42g, and the incrementing unit 42h and a gated clock buffer constituted by the AND circuit 42e.

Figures 2A, 2B:
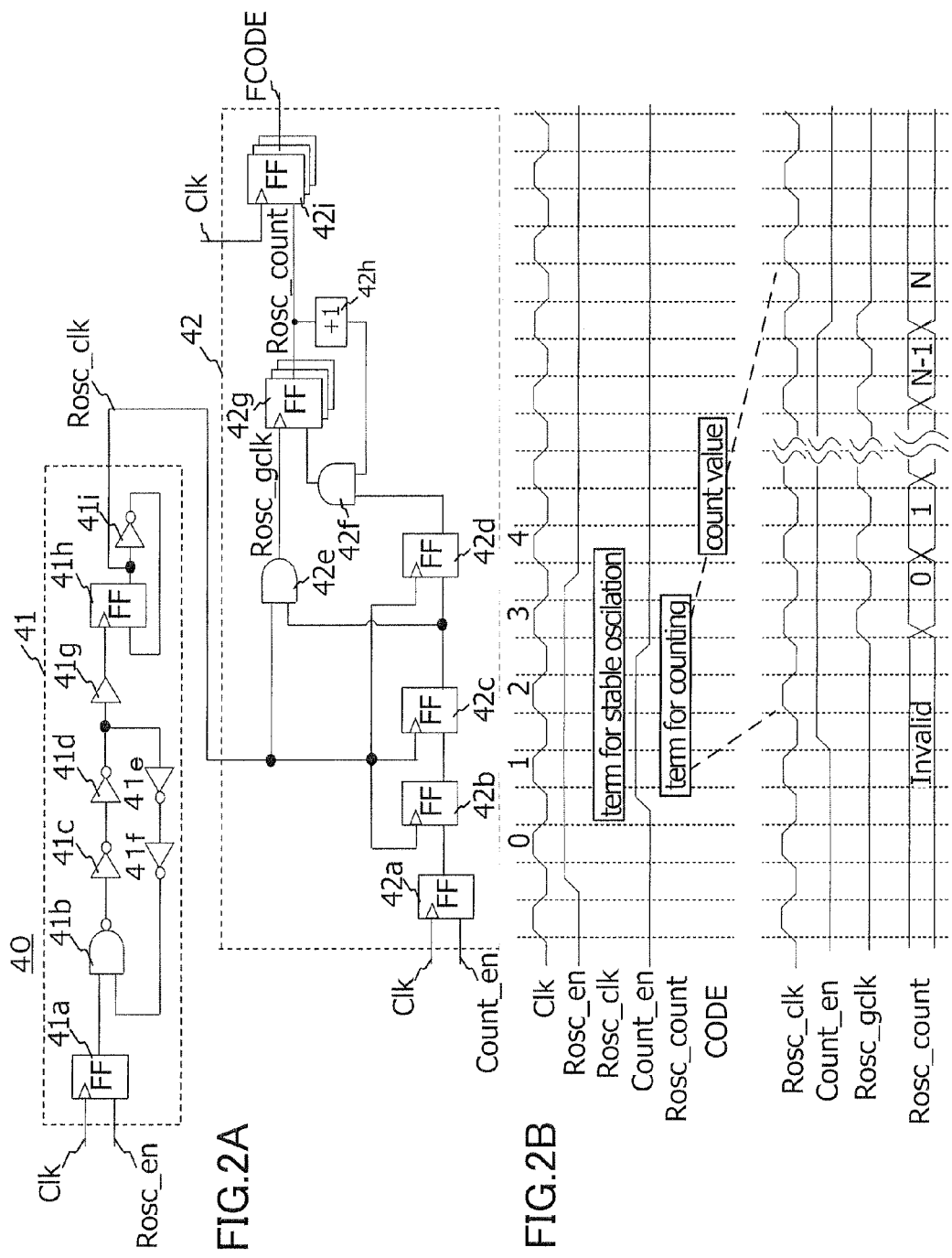
FIG. 2A illustrates a temperature sensor and FIG. 2B illustrates operation waveforms of the temperature sensor.

FIG. 2B illustrates operation waveforms of the temperature sensor 40 illustrated in FIG. 2A. In FIG. 2B, the clock signals clk and rocs_clk are asynchronous with each other and clock cycles thereof are different from each other. The cycle of the clock signal rocs_clk is determined in accordance with a delay characteristic of the ring oscillator unit 41.

When the signal rocs_en is asserted, oscillation of the ring oscillator unit 41 is started and the toggle of the signal rocs_clk is started. Next, when the signal count_en is asserted, toggle of a gated clock signal rocs_gclk is started. Then, the number of times the gated clock signal rocs_gclk is toggled is counted using the flip-flop circuit 42g and the incrementing unit 42h. The count value is output as a signal rosc_count from the flip-flop circuit 42g, stored in the flip-flop circuit 42i, and then, output as the signal FCODE. Note that the signal FCODE is output as the temperature measuring result 44 from the temperature sensor 40 to the consumption energy calculating circuit 13a.

Note that since the signals clk and rocs_clk are asynchronous with each other, the signals rocs_en and count_en are separately supplied so that the asynchronous transfer does not adversely affect a timing of start or stop of the oscillation and a timing of start or stoop of the counting.

When the signal count_en is negated, the toggle of the clock signal rocs_gclk is stopped and the flip-flop circuit 42g stops counting. A value N of the signal FCODE obtained at this timing represents the number of times the ring oscillator unit 41 constituted by the Low-Vth MOS transistor has oscillated.

FIGS. 3A and 3B are conversion tables used when a process size variation code [2:0] of three bits and a temperature code [2:0] of three bits are to be output using an oscillation frequency code [7:0] (FCODE) of seven bits as an input.

In the conversion table illustrated in FIG. 3A, the oscillation frequency code [7:0] (FCODE) represents a value which is obtained by counting clocks generated by the ring oscillator unit 41 constituted by the Low-Vth MOS transistor and which corresponds to a process size variation. Then, a maximum value of the value obtained by counting the clocks by the clock counting unit 42 is determined to 83 and count values are categorized into eight categories from 0 to 7. That is, degrees of the process size variation are represented by eight categories. The process size variation code (PCODE) [2:0] represents a code corresponding to one of the eight categories.

Note that the correspondence relationship between an oscillation frequency code (FCODE) and a process size variation code (PCODE) is obtained by performing a simulation in advance using a circuit simulator such as a SPICE (Simulation Program with Integrated Circuit Emphasis).

In the conversion table for a process size variation code 7 illustrated in FIG. 3B, the oscillation frequency code [7:0] (FCODE) represents a value which is obtained by counting clocks generated by the ring oscillator unit 41 which is constituted by the Low-Vth transistor and which corresponds to a temperature variation. Then, a maximum value of the value counted by the clock counting unit 42 is determined to 99 and count values are categorized into eight categories from 0 to 7. The temperature code [2:0] (TCODE) represents a code corresponding to one of the eight categories.

Then, oscillation frequencies 80 to 83 corresponding to a temperature code [2:0] (TCODE) of 3 are the same as oscillation frequencies corresponding to a process size variation code (PCODE) of 7 in the conversion table illustrated in FIG. 3A.

Accordingly, a conversion table corresponding to a process size variation code (PCODE) of 7 illustrated in FIG. 3B is used to obtain a temperature code (TCODE) using a value obtained by counting clocks generated by the ring oscillator unit 41 in a case where a degree of process size variation corresponds to a code 7.

Similarly, conversion tables corresponding to process size variation code (PCODE) of 6 to 0 illustrated in FIG. 3B are used to obtain temperature codes (TCODEs) using values obtained by counting clocks generated by the ring oscillator unit 41 in a case where degrees of process size variations correspond to codes 6 to 0. This is because, as described above, in each of the conversion tables illustrated in FIG. 3B, an oscillation frequency obtained when the temperature code (TCODE) corresponds to the code 3 is the same as that corresponding to the process size variation code (PCODE) of 7.

Figure 4:
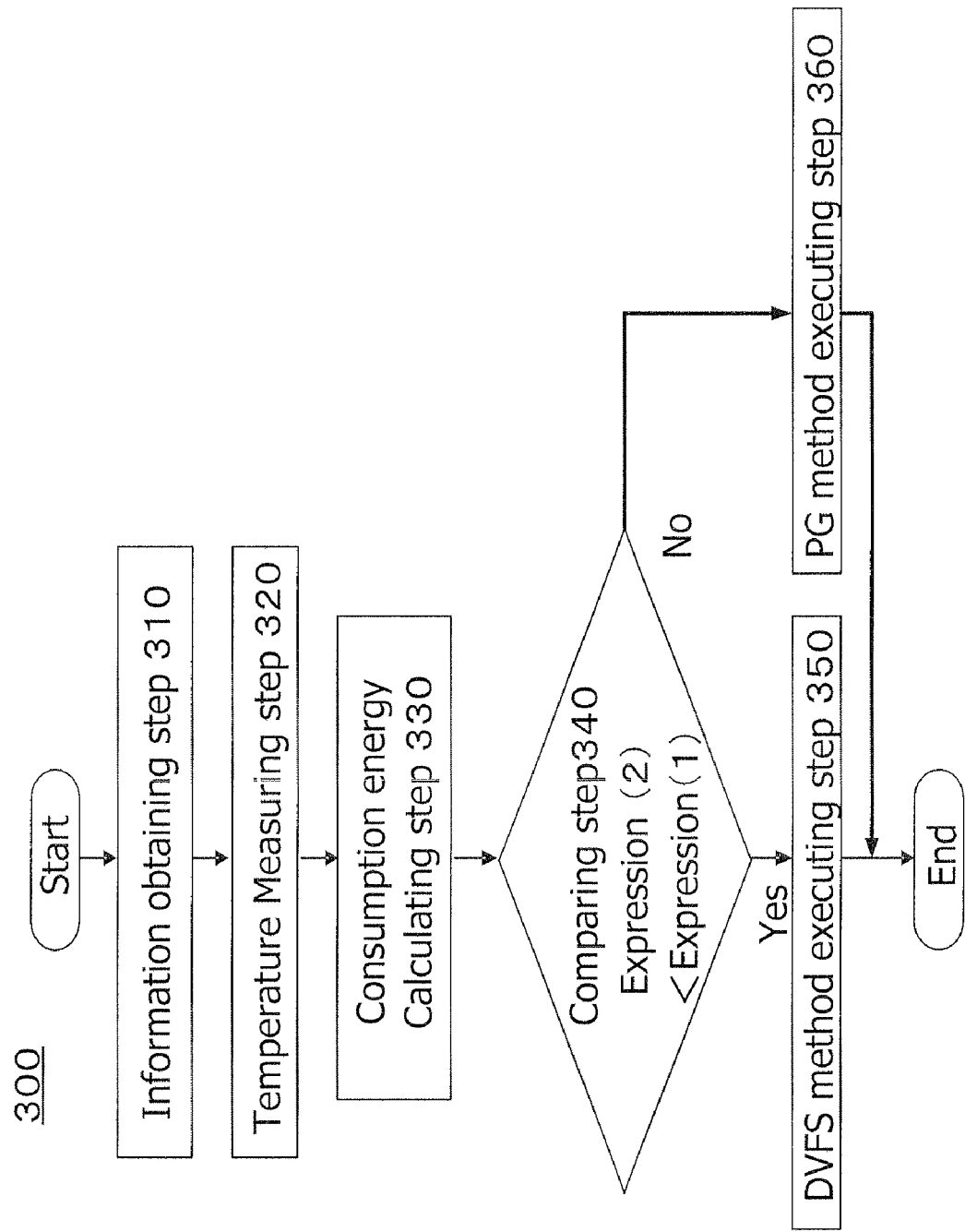
FIG. 4 is a flowchart illustrating one of a DVFS (Dynamic Voltage and Frequency Scaling) method and a PG (Power Gating) method which is selected for each task by a consumption energy calculating circuit and a switching circuit.

FIG. 4 illustrates a flowchart 300 illustrating one of the DVFS method and the PG method which is selected for each task by the consumption energy calculating circuit 13a and the switching circuit 12.

The flowchart 300 includes a starting step, an information obtaining step 310, a temperature measuring step 320, a consumption energy calculating step 330, a comparing step 340, a DVFS-method executing step 350, a PG-method executing step 360, and a terminating step.

In the information obtaining step 310, the switching circuit 12 obtains information on an operation frequency, a power-supply voltage, a WCET, and an activation rate of a task when the DVFS method is performed and obtains information on a operation frequency, a power-supply voltage, a WCET, and an activation rate of a task when the PG method is performed.

In the temperature measuring step 320, when receiving a temperature measuring instruction supplied from the switching circuit 12, the consumption energy calculating circuit 13a outputs the temperature measuring instruction 43 to the temperature sensor 40 so as to obtain the temperature measuring result 44 from the temperature sensor 40.

Note that, in a test process of the semiconductor integrated circuit 100, a conversion table to be used to obtain a temperature may be specified by measuring a count value obtained by the clock counting unit 42 while the temperature sensor 40 illustrated in FIG. 2A operates with a fixed temperature.

Thereafter, the correspondence relationship between a temperature code and an actual temperature may be obtained by measuring the count value obtained by the clock counting unit 42 of the temperature sensor 40 while the temperature is changed.

In the consumption energy calculating step 330, an energy consumed when the PG method is selected is calculated using Expression (1) and an energy consumed when the DVFS method is selected is calculated using Expression (2). Note that power-supply voltages, operation frequencies, activation rates, and WCETs used to calculate Expressions (1) and (2) are obtained from the storage unit 17a which stores a table illustrated in FIG. 5. Similarly, a value Ileak is obtained from the storage unit 17a which stores a table illustrated in FIG. 6.

In the comparing step 340, the consumption energy obtained using Expression (1) and the consumption energy obtained using Expression (2) are compared with each other so that it is determined which one is smaller. In accordance with a result of the determination, the following step is performed.

When it is determined that the consumption energy obtained using Expression (2) is smaller, that is, the consumption energy obtained when the DVFS method is performed is smaller, the DVFS method is performed in the DVFS-method executing step 350.

On the other hand, when it is determined that the consumption energy obtained using Expression (1) is smaller, that is, the consumption energy obtained when the PG method is performed is smaller, the PG method is performed in the PG-method executing step 360.

After the DVFS method or the PG method is performed, the task is terminated.

FIG. 5 is a table illustrating power-supply voltages, operation frequencies, activation rates, and WCETs for individual tasks used to calculate a consumption energy when the PG method or the DVFS method is executed.

The table illustrated in FIG. 5 includes columns of the tasks, the operation frequencies, the power-supply voltages, the WCETs, and the activation rates. Note that the table regarding the power-supply voltages, the operation frequencies, the WCETs, and the activation rates is stored in the storage unit 17a.

FIG. 6 is a table illustrating leakage currents (Ileak) of the internal circuit 11a relative to various temperatures which are used to calculate a consumption energy when the PG method or the DVFS method is executed. The table illustrated in FIG. 6 includes columns of temperatures and leakage currents. Note that the table regarding the values Ileak (leakage currents) relative to the temperatures is stored in the storage unit 17a.

Figure 7:
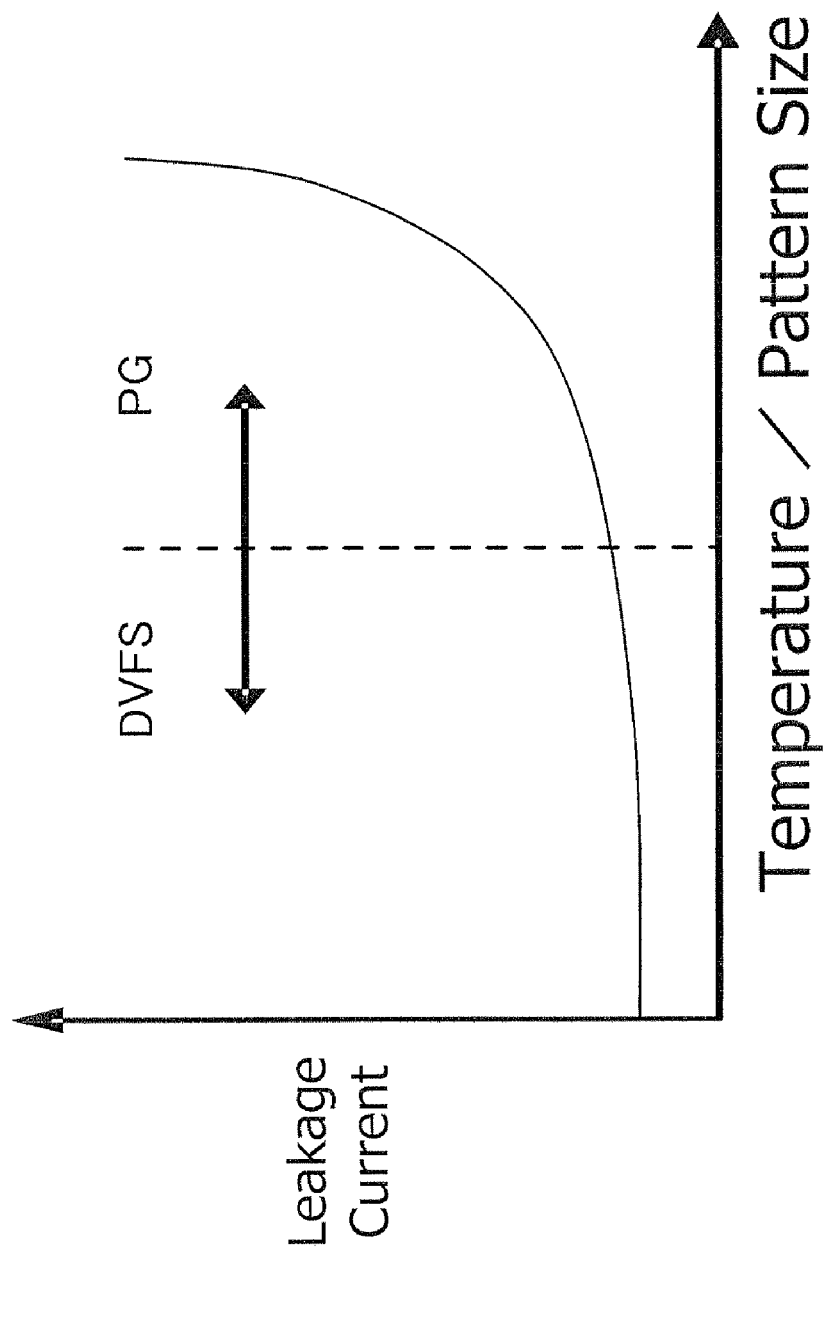
FIG. 7 is a graph illustrating a state of a leakage current relative to a temperature or a fabrication variation.

FIG. 7 is a graph illustrating a state of a leakage current relative to a temperature or a fabrication variation. In the graph, an axis of abscissa denotes a temperature or a size of a pattern generated owing to a fabrication variation. Note that the temperature on the right side is higher whereas the pattern size on the right side is smaller. An axis of ordinate denotes a value of a leakage current. In the graph, a dotted line represents a predetermined value of the temperature or the size of the pattern generated owing to the fabrication variation.

According to the graph illustrated in FIG. 7, when the temperature is lower than the predetermined value denoted by the dotted line, the leakage current of the circuit is small whereas when the temperature is higher than the predetermined value denoted by the dotted line, the leakage current is drastically increased. Furthermore, when the pattern size generated owing to the fabrication variation is larger than the predetermined value denoted by the dotted line, the leakage current of the circuit is small whereas when the pattern size generated owing to the fabrication variation is smaller than the predetermined value denoted by the dotted line, the leakage current of the circuit is drastically increased.

When the leakage current of the circuit is small, the consumption energy is effectively reduced by DVFS method. On the other hand, when the leakage current of the circuit is increased, the consumption energy is effectively reduced by the PG method.

Figure 8:
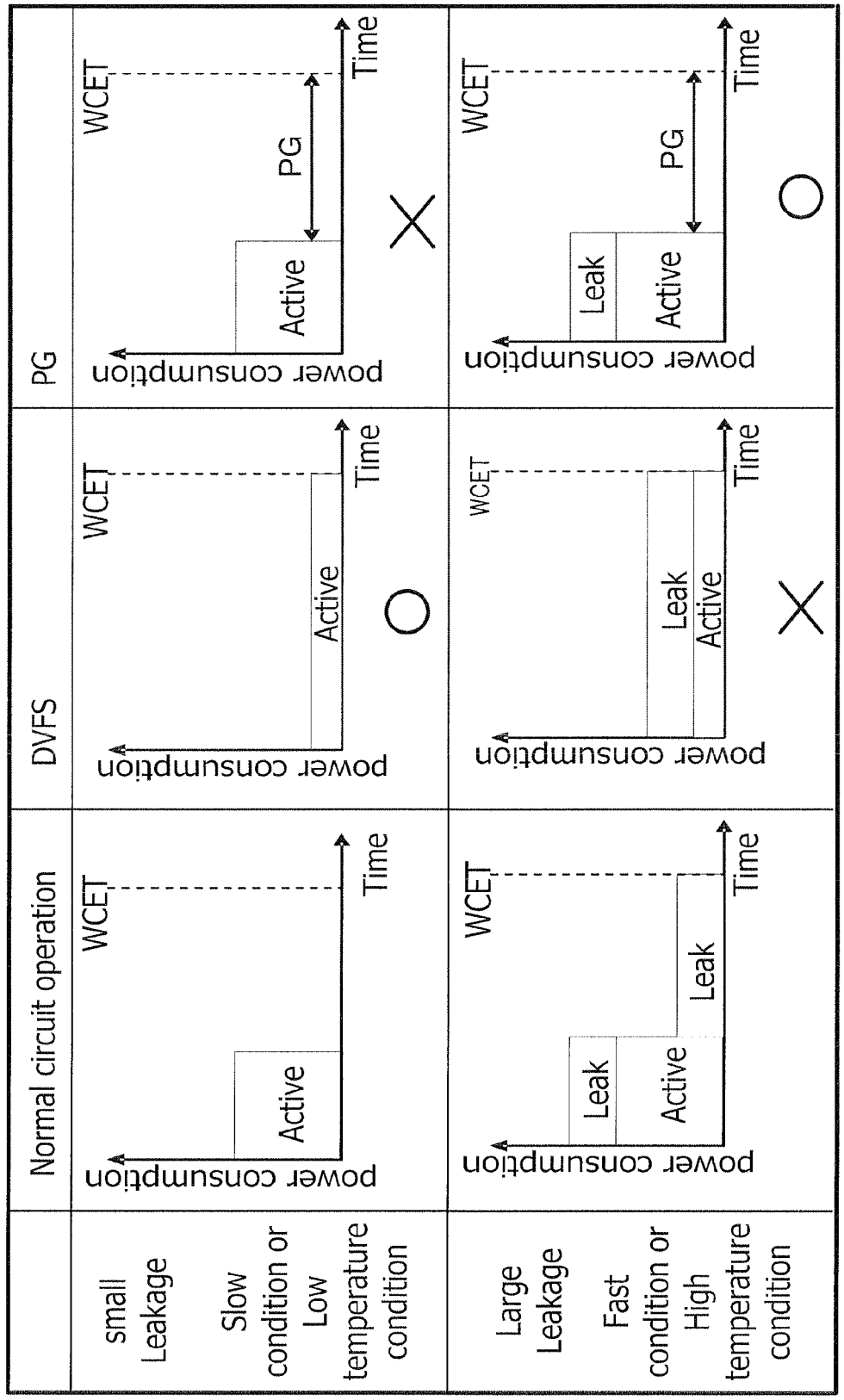
FIG. 8 is a table illustrating time dependencies of a consumption current of a certain task when the circuit normally operates, when the circuit operates in the DVFS method, and when the circuit operates in the PG method.

FIG. 8 is a table illustrating time dependencies of a consumption current of a certain task when the circuit normally operates, when the circuit operates in the DVFS method, and when the circuit operates in the PG method. Referring to the table illustrated in FIG. 8, a reason that the PG method is employed when the leakage current of the circuit is large whereas the DVFS method is employed when the leakage current of the circuit is small will be described.

In the table illustrated in FIG. 8, an upper row includes graphs representing time dependencies of a power consumption when a temperature is low and a size of a pattern generated owing to the fabrication variation corresponds to a slow condition. A lower row includes graphs representing time dependencies of a power consumption when a temperature is high and a size of a pattern generated owing to the fabrication variation corresponds to a fast condition.

In the table 8, a first column includes graphs representing time dependencies of a power consumption in a normal circuit operation. A second column includes graphs representing time dependencies of a power consumption in a circuit operation in which the DVFS method is employed. A third column includes graphs representing time dependencies of a power consumption in a circuit operation in which the PG method is employed.

According to the graph located in the upper row and the first column, when a task requests an circuit operation only for an predetermined period of time in a WCET period, the internal circuit 11a performs an active operation with a large consumption energy for the predetermined period of time. However, in the other period of time, only an energy caused by a leakage current of the internal circuit 11a is consumed.

In the graph located in the upper row and the second column, a time dependency of a consumption energy of the internal circuit 11a obtained when the DVFS method is employed for the task is illustrated. By reducing an operation voltage and an operation frequency, the internal circuit 11a performs an active operation in the entire WCET period.

Since the consumption energy is proportional to a square of the voltage and is proportional to the frequency, the consumption energy per unit time is reduced. Therefore, since the consumption energy per unit time is reduced although the operation period of the internal circuit 11a becomes longer, the consumption energy used when the internal circuit 11a processes the task is reduced.

In the graph located in the upper row and the third column, a time dependency of a consumption energy of the internal circuit 11a when the PG method is employed is illustrated. The internal circuit 11a performs an active operation with a large consumption energy for a predetermined period of time. For the other period of time, since control in accordance with the PG method is employed in the internal circuit 11a, the internal circuit 11a consumes neither an energy caused by the active operation nor an energy caused by the leakage current. However, since the consumption energy caused by the leakage current is small even in the normal operation, reduction of the consumption energy used when the internal circuit 11a processes the task is negligible.

In the graph located in the lower row and the first column, a time dependency of a consumption energy generated when the internal circuit 11a processes the task described above in the normal operation in a state in which the leakage current of the internal circuit 11a is large is illustrated. The internal circuit 11a consumes a large energy caused by the active operation and the leakage current for a predetermined period of time. Furthermore, for the other period of time, the internal circuit 11a consumes an energy caused by the leakage current.

In the graph located in the lower row and the second column, a time dependency of a consumption energy generated when the internal circuit 11a processes the task described above when the DVFS method is employed in the state in which the leakage current of the internal circuit 11a is large is illustrated. The consumption energy caused by the active operation may be reduced by reducing the operation frequency and the operation voltage of the internal circuit 11a. However, the consumption energy caused by the leakage current is not reduced but large, and therefore, reduction of the entire consumption energy consumed when the internal circuit 11a processes the task is negligible.

In the graph located in the lower row and the third column, a time dependency of a consumption energy generated when the internal circuit 11a processes the task described above when the PG method is employed in the state in which the leakage current of the internal circuit 11a is large is illustrated.

The internal circuit 11a consumes a large energy caused by the active operation and the leakage current for a predetermined period of time. However, for the other period of time, the internal circuit 11a consumes neither an energy caused by the active operation nor an energy caused by the leakage current. As a result, the consumption energy caused by the leakage current in a non-active period may be reduced, and therefore, the consumption energy used when the internal circuit 11a processes the task may be reduced.

As described above, when the leakage current in the circuit is large, the PG method is suitable employed whereas when the leakage current in the circuit is small, the DVFS method is suitable employed for reducing the consumption energy used when the internal circuit 11a processes the task.

Figure 9:
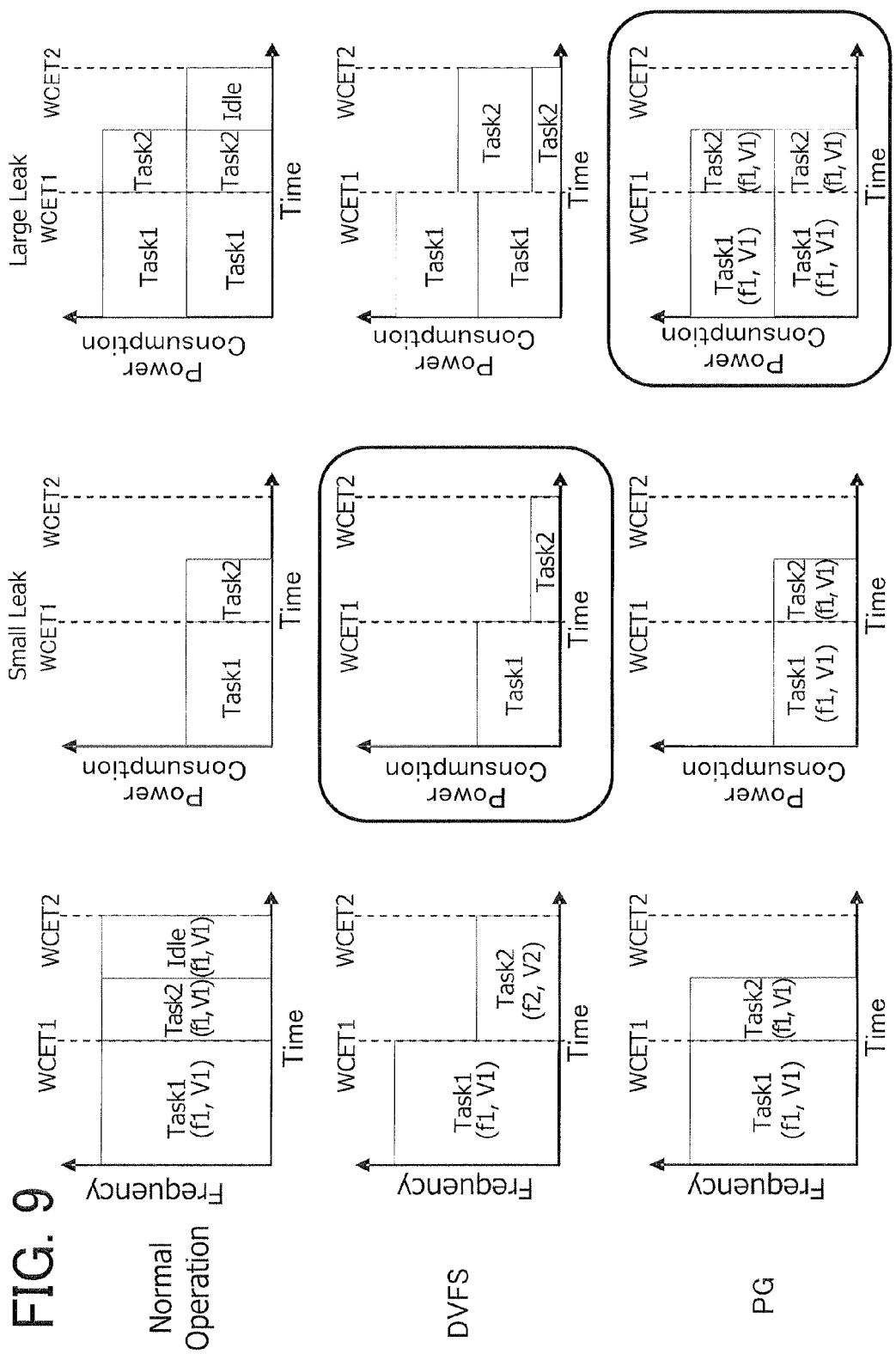
FIG. 9 is a table illustrating time dependencies of a consumption current when first and second tasks are continuously performed in a case where the circuit normally operates, in a case where the circuit operates in the DVFS method, and in a case where the circuit operates in the PG method.

FIG. 9 is a table illustrating time dependencies of a consumption current when first and second tasks are continuously performed in a case where the circuit normally operates, in a case where the circuit operates in the DVFS method, and in a case where the circuit operates in the PG method. A reason that the PG method is employed when the leakage current of the circuit is large whereas the DVFS method is employed when the leakage current of the circuit is small also in this case will be described.

A first column illustrated in FIG. 9 includes graphs representing operation frequencies of the internal circuit 11a when the first and second tasks are continuously performed.

In the graph located in the first column and a first row, when a normal operation is performed, that is, neither the DVFS method nor the PG method is employed, the internal circuit 11a operates with a frequency f1 and a voltage V1 in the first and second tasks.

Furthermore, in the graph located in the first column and a second row, when the DVFS method is employed, the internal circuit 11a operates with the frequency f1 and the voltage V1 in the first task, and operates with a frequency f2 and a voltage V2 in the second task.

Moreover, in the graph located in the first column and a third row, when the PG method is employed, the internal circuit 11a operates with the frequency f1 and the voltage V1 in the first and second tasks.

A second column illustrated in FIG. 9 includes graphs representing time dependencies of a power consumption of the internal circuit 11a when the leakage current of the internal circuit 11a is small and when the first and second tasks are continuously performed.

Then, in the graph located in the second column and the first row, at the time of the normal operation, when operating with the operation frequency f1 and the operation voltage V1, the internal circuit 11a performs an active operation for an entire WCET1 period in which the first task is processed. Then, the internal circuit 11a consumes a certain consumption energy requested for the active operation. On the other hand, when operating with the operation frequency f1 and the operation voltage V1, the internal circuit 11a stops the active operation approximately in a halfway of a WCET2 period in which the second task is processed. Then, the internal circuit 11a consumes a certain energy while the internal circuit 11a performs the active operation.

In the graph located in the second column and the second row, also when the DVFS method is employed, the first task is processed in the WCET1 period, and the internal circuit 11a operates with the operation frequency f1 and the operation voltage V1. Accordingly, the internal circuit 11a consumes a certain energy requested for the active operation in the entire WCET1 period. When the second task is to be processed in the WCET2 period, the internal circuit 11a operates with the operation frequency f2 and the operation voltage V2. Accordingly, the internal circuit 11a consumes a certain energy requested for the active operation performed with the operation frequency f2 and the operation voltage V2 in the entire WCET2 period. Consequently, an energy consumed by the internal circuit 11a is reduced while the second task is processed.

In the graph located in the second column and the third row, also when the PG method is employed, the first task is processed in the WCET1, and the internal circuit 11a operates with the operation frequency f1 and the operation voltage V1. Accordingly, the internal circuit 11a consumes a certain energy requested for the active operation for the entire WCET1 period. Furthermore, when the second task is to be processed in the WCET2 period, the internal circuit 11a performs an active operation with the operation frequency f1 and the operation voltage V1 and the active operation is terminated approximately in the halfway of the WCET2 period. Thereafter, the power supply to the internal circuit 11a is stopped. However, since the leakage current of the internal circuit 11a is small, reduction of the consumption energy while the first and second tasks are processed is negligible.

A third column illustrated in FIG. 9 includes graphs representing time dependencies of a power consumption of the internal circuit 11a when the leakage current of the internal circuit 11a is large and when the first and second tasks are continuously performed.

In the graph located in the third column and the first row, at a time of the normal operation, when operating with the operation frequency f1 and the operation voltage V1, the internal circuit 11a performs an active operation for the entire WCET1 period in which the first task is performed. Furthermore, similarly to the operation described above, the internal circuit 11a performs the active operation approximately in the half of the WCET2 period in which the second task is processed. Note that since the leakage current of the internal circuit 11a is large, the internal circuit 11a consumes an energy in accordance with the leakage current for the entire WCET1 and WCET2 periods. Furthermore, the internal circuit 11a consumes an energy in accordance with the active operation for the WCET1 period in which the first task is processed and a period in which the second task is processed (a period corresponding to the half of the WCET2 period).

In the graph located in the third column and the second row, when the DVFS method is employed, the internal circuit 11a consumes an energy requested for the active operation performed with the operation frequency f1 and the operation voltage V1 while the first task is processed. Furthermore, while the second task is processed, the internal circuit 11a consumes an energy requested for the active operation performed with the operation frequency f2 and the operation voltage V2. In addition, the internal circuit 11a consumes an energy in accordance with the leakage current in the WCET1 period or the WCET2 period. Accordingly, since the energy consumed in accordance with the leakage current is large, reduction of an energy consumed by the internal circuit 11a is negligible.

In the graph located in the third column and the third row, when the PG method is employed, the internal circuit 11a consumes an energy requested for the active operation performed with the operation frequency f1 and the operation voltage V1 and an energy in accordance with the leakage current. Furthermore, in the process of the second task, for a period of time requested for processing the second task, the internal circuit 11a consumes an energy requested for the active operation performed with the operation frequency f1 and the operation voltage V1 and an energy in accordance with the leakage current. However, after the second task is terminated, the internal circuit 11a does not consume the energy requested for the active operation and the energy in accordance with the leakage current.

Accordingly, since the energy consumed in accordance with the leakage current is large, the energies requested for processing the first and second tasks are considerably smaller than those in the normal operation.

As described above, even in the case where the first and second tasks are continuously processed as described above, the PG method is suitably used when the leakage current of the circuit is large whereas the DVFS method is suitably used when the leakage current of the circuit is small so that an energy consumed when the internal circuit 11a performs the tasks is reduced.

Figure 10:
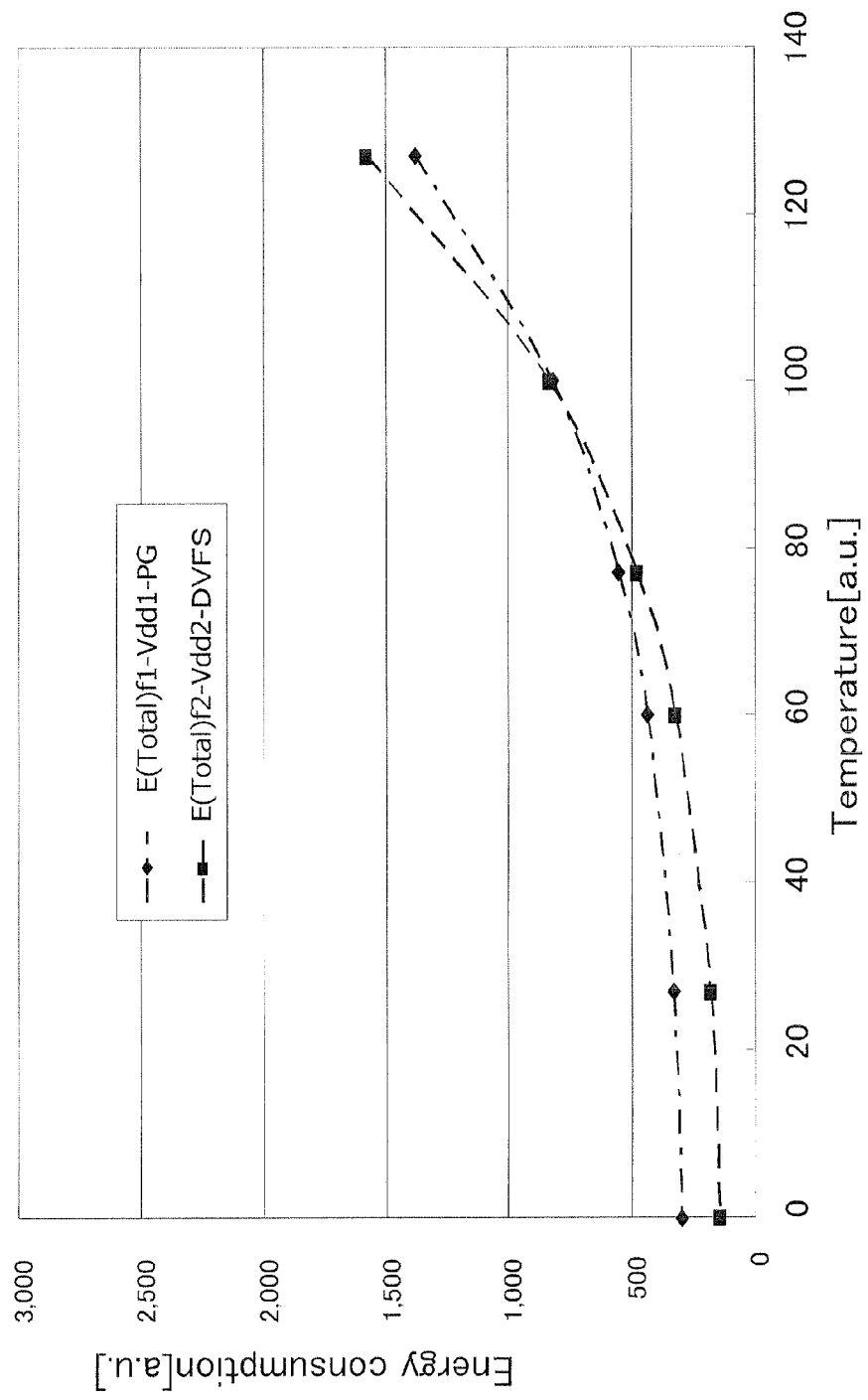
FIG. 10 is a graph illustrating the relationship between a temperature and a consumption energy.

FIG. 10 is a graph illustrating the relationship between a temperature and a consumption energy. An axis of abscissa denotes a temperature and an axis of ordinate denotes a consumption energy. Marks of a black diamond shape and a dashed-dotted line connecting the marks represent a consumption energy requested for processing a task by the internal circuit 11a when the PG method is employed. Black square marks and a dashed line connecting the marks represent a consumption energy requested for processing the task by the internal circuit 11a when the DVFS method is employed. Note that when the PG method is employed, the internal circuit 11a operates with an operation frequency f1 and an operation voltage Vdd2. On the other hand, when the DVFS method is employed, the internal circuit 11a operates with an operation frequency f2 and an operation voltage Vdd2.

When the temperature is low, use of the DVFS method enables an energy consumed by the internal circuit 11a to be small. However, when the temperature becomes high to exceed a predetermined temperature, use of the PG method enables the energy consumed by the internal circuit 11a to be small.

As described above, the semiconductor integrated circuit 100 of the first embodiment includes the temperature sensor 40, the consumption energy calculating circuit 13a, the switching circuit 12, the power-supply-voltage control circuit 50, the clock control circuit 60, and the power gating control circuit 20 which function as follows. The temperature sensor 40 counts a frequency of the ring oscillator determined in accordance with a characteristic of the MOS transistor in operation. The consumption energy calculating circuit 13a obtains a temperature from the frequency and obtains a leakage current corresponding to the temperature, calculates a consumption energy of the internal circuit 11a when the PG method is employed and a consumption energy of the internal circuit 11a when the DVFS method is employed, and outputs a result of a comparison between the obtained consumption energies. The switching circuit 12 changes a method to be employed for the internal circuit 11a in accordance with the comparison result. The power-supply-voltage control circuit 50 and the clock control circuit 60 change the frequency and the voltage in accordance with a signal supplied from the switching circuit 12. The power gating control circuit 20 controls a connection of the power source to the internal circuit 11a and a disconnection of the power source from the internal circuit 11a in accordance with a signal supplied from the switching circuit 12. Therefore, the semiconductor integrated circuit 100 determines a method which reduces the consumption energy of the internal circuit 11a among the DVFS method and the PG method in accordance with an element characteristic of the semiconductor integrated circuit 100 so as to select one of the methods which realizes a large reduction effect for the operation. Consequently, the consumption current of the semiconductor integrated circuit 100 is considerably reduced.

The semiconductor integrated circuit 100 according to the first embodiment selects the PG method or the DVFS method to be employed for the internal circuit 11a in accordance with the temperature measured by the temperature measuring circuit after the process condition is specified in the test process. On the other hand, a semiconductor integrated circuit 300 according to a second embodiment selects the PG method or the DVFS method to be employed for the internal circuit 11a in accordance with a result of a process condition measurement obtained in a test process performed in a fixed temperature.

Figure 11:
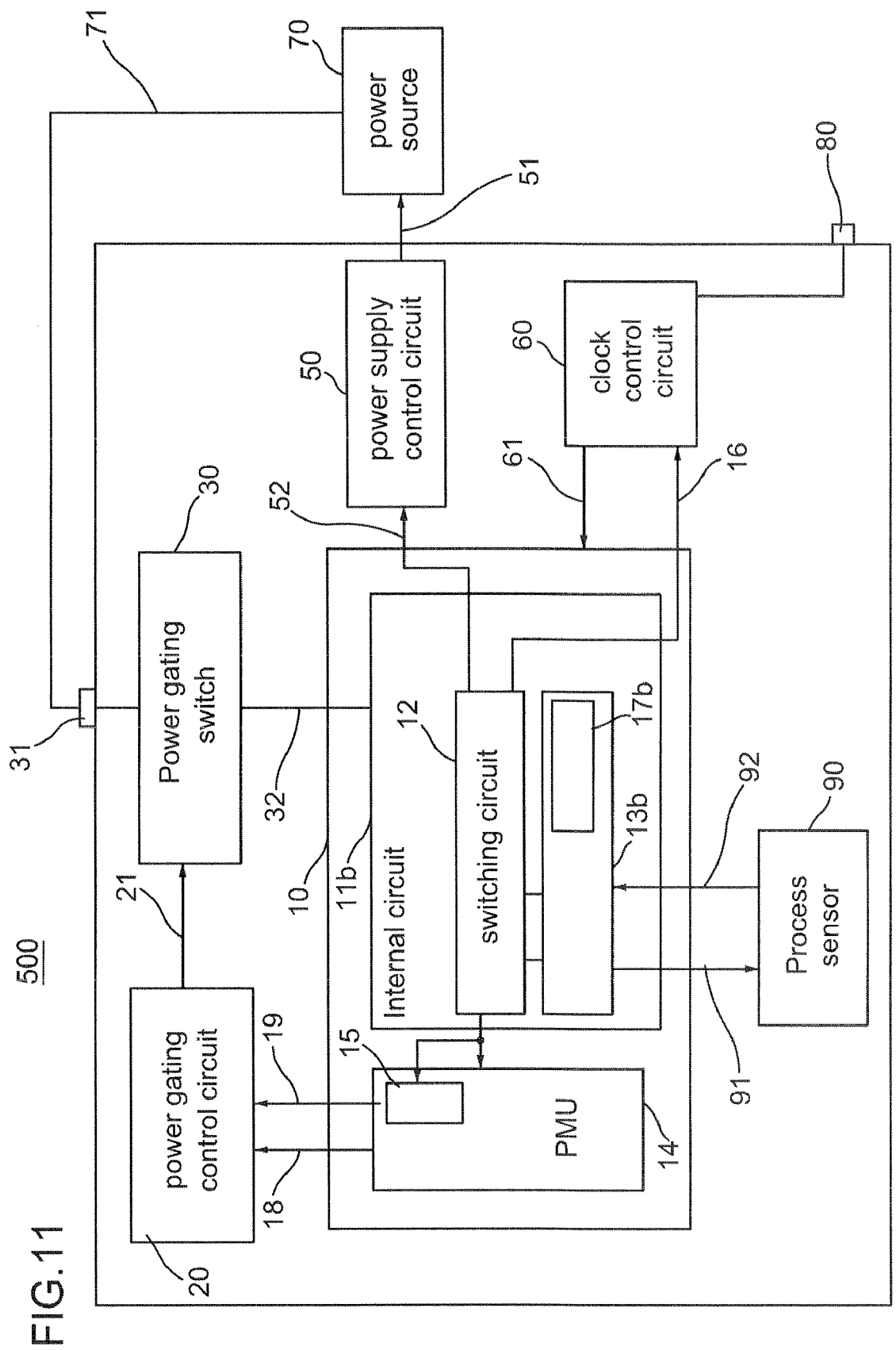
FIG. 11 illustrates a semiconductor integrated circuit and a power source according to a second embodiment.

FIG. 11 illustrates a semiconductor integrated circuit 500 and a power source 70 according to the second embodiment. The semiconductor integrated circuit 500 includes a CPU 10, a power gating control circuit 20, a power gating switch 30, a process sensor 90, a power-supply-voltage control circuit 50, a clock control circuit 60, an external clock-signal terminal 80, and a power-supply terminal 31.

In the semiconductor integrated circuit 500, the power gating control circuit 20, the power gating switch 30, the power-supply-voltage control circuit 50, the clock control circuit 60, the external clock-signal terminal 80, and the power-supply terminal 31 are the same as those included in the semiconductor integrated circuit 100.

The CPU 10 includes an internal circuit 11b and a PMU 14. The PMU 14 is the same as that of the first embodiment.

The internal circuit 11b includes a switching circuit 12 and a consumption energy calculating circuit 13b. The switching circuit 12 is the same as that of the first embodiment.

The consumption energy calculating circuit 13b outputs a process condition measuring instruction 91 to the process sensor 90 so as to obtain a process condition measuring result 92.

Then, the consumption energy calculating circuit 13b calculates an energy consumed by the internal circuit 11b when the PG method is employed using Expression (1). Furthermore, the consumption energy calculating circuit 13b calculates an energy consumed by the internal circuit 11b when the DVFS method is employed using Expression (2) in accordance with the process condition measuring result 92. When receiving a result obtainment signal supplied from the switching circuit 12, the consumption energy calculating circuit 13b outputs a result notification signal of a logic "H" when the consumption energy obtained through Expression (1) is larger than the consumption energy obtained through Expression (2), and otherwise, outputs a result notification signal of a logic "L".

Then, the consumption energy calculating circuit 13b stores in a storage unit 17b included in the consumption energy calculating circuit 13b a table including values f1, Vdd1, f2, Vdd2, WCET, and A and a table including values Ileak corresponding to various process size variation codes (PCODEs). Furthermore, the storage unit 17b included in the consumption energy calculating circuit 13b stores the code conversion table which has been described with reference to FIG. 3A.

Then, the consumption energy calculating circuit 13b obtains a value Ileak corresponding to a certain process size variation code as follows.

First, when an operation test of the semiconductor integrated circuit 500 according to the second embodiment is to be performed, the consumption energy calculating circuit 13b obtains a process size variation code (PCODE) using the code conversion table described above from the process condition measuring result 92, i.e., an FCODE, obtained by operating the process sensor 90 while the temperature is fixed. Then, the consumption energy calculating circuit 13b stores the process size variation code (PCODE) in the storage unit 17b.

The consumption energy calculating circuit 13b obtains a value Ileak using the table of the values Ileak corresponding to the various process size variation codes stored in the storage unit 17b.

Accordingly, the consumption energy calculating circuit 13b outputs a result notification signal including a logic obtained when the semiconductor integrated circuit 500 according to the second embodiment is in a operation test state to the switching circuit 12 at a time of a normal operation.

The process sensor 90 is similar to the temperature sensor 40 illustrated in FIG. 2A. The process sensor 90 includes a ring oscillator unit 41 and a clock counting unit 42.

That is, when receiving the process condition measuring instruction 91 supplied from the consumption energy calculating circuit 13b, the process sensor 90 outputs a count value output from the clock counting unit 42, i.e., the FCODE, as the process condition measuring result 92.

FIG. 12 is a table illustrating leakage currents (Ileak) of the circuit relative to various process size variation codes which is used to calculate a consumption energy when the PG method or the DVFS method is executed. The table illustrated in FIG. 12 includes a column representing a process size variation and a column representing a leakage current. Note that the table including the relationships between process size variations and values Ileak (leakage currents) of the circuit is stored in the storage unit 17b.

As described above, the semiconductor integrated circuit 500 of the second embodiment includes the process sensor 90, the consumption energy calculating circuit 13b, the switching circuit 12, the power-supply-voltage control circuit 50, and the clock control circuit 60, and the power gating control circuit 20 which function as follows. The process sensor 90 detects a frequency of the ring oscillator which depends on an element characteristic of the MOS transistor when the test process is performed. The consumption energy calculating circuit 13b specifies a leakage current of the MOS transistor in a process condition corresponding to the frequency, calculates a consumption energy of the internal circuit 11b when the PG method is employed and a consumption energy of the internal circuit 11b when the DVFS method is employed, and outputs a result of a comparison between the consumption energies. The switching circuit 12 changes a method employed for the internal circuit 11b in accordance with the comparison result. The power-supply-voltage control circuit 50 and the clock control circuit 60 change the frequency and the voltage in accordance with a signal supplied from the switching circuit 12. The power gating control circuit 20 controls connection of power source to the internal circuit 11b and disconnection of the power source from the internal circuit 11b in accordance with a signal supplied from the switching circuit 12. Therefore, the semiconductor integrated circuit 500 determines a method which reduces the consumption energy of the internal circuit 11b among the DVFS method and the PG method in accordance with the element characteristic of the semiconductor integrated circuit 500 so as to select one of the methods which realizes a large reduction effect for the operation. Consequently, the consumption current of the semiconductor integrated circuit 500 is considerably reduced.

The semiconductor integrated circuit 100 according to the first embodiment includes the temperature measuring circuit which specifies a process condition in the test process and selects the PG method or the DVFS method to be employed for the internal circuit 11a in accordance with a measured temperature. On the other hand, a semiconductor integrated circuit 600 according to a third embodiment includes a circuit which specifies a process condition separately from a temperature measuring circuit. The semiconductor integrated circuit 600 selects a method for reducing a power consumption which is to be employed for an internal circuit in accordance with a process condition specified by the circuit which specifies a process condition and a temperature measured by the temperature measuring circuit.

Figure 13:
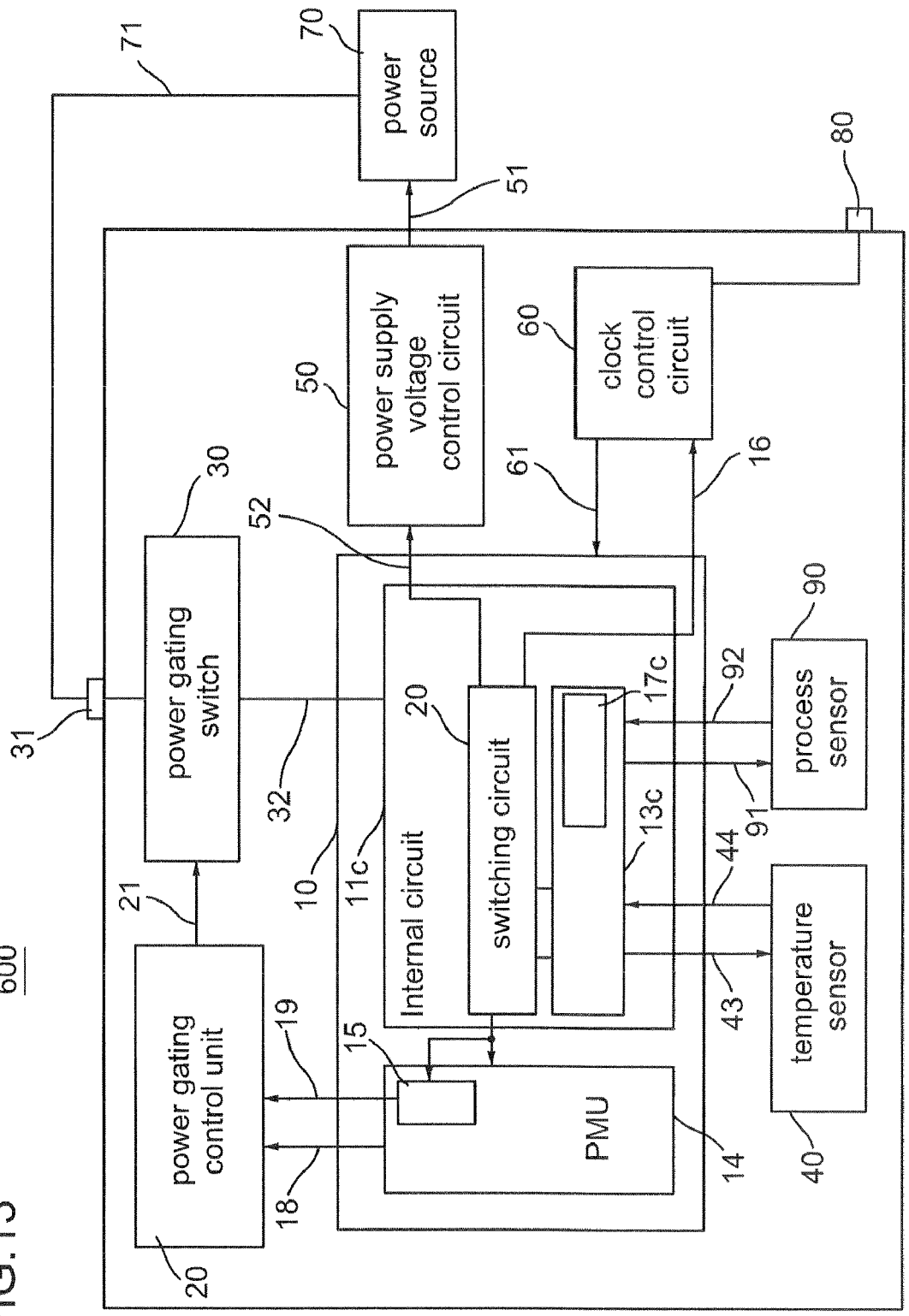
FIG. 13 illustrates a semiconductor integrated circuit and a power source according to a third embodiment.

FIG. 13 illustrates the semiconductor integrated circuit 600 and a power source 70 according to the third embodiment. The semiconductor integrated circuit 600 includes a CPU 10, a power gating control circuit 20, a power gating switch 30, a temperature sensor 40, a process sensor 90, a power-supply-voltage control circuit 50, a clock control circuit 60, an external clock-signal terminal 80, and a power-supply terminal 31.

In the semiconductor integrated circuit 600, the power gating control circuit 20, the power gating switch 30, the power-supply-voltage control circuit 50, the clock control circuit 60, the external clock-signal terminal 80, and the power-supply terminal 31 are the same as those of the semiconductor integrated circuit 100.

The CPU 10 includes an internal circuit 11c and a PMU 14. The PMU 14 is the same as that of the first embodiment.

The internal circuit 11c includes a switching circuit 12 and a consumption energy calculating circuit 13c. The switching circuit 12 is the same as that of the first embodiment.

The consumption energy calculating circuit 13c outputs a process condition measuring instruction 91 to the process sensor 90 so as to obtain a process condition measuring result 92. Furthermore, the consumption energy calculating circuit 13c outputs a temperature measurement instruction 43 to the temperature sensor 40 so as to obtain a temperature measurement result 44.

Then, the consumption energy calculating circuit 13c calculates an energy consumed by the internal circuit 11c when the PG method is employed using Expression (1). Furthermore, the consumption energy calculating circuit 13c calculates an energy consumed by the internal circuit 11c when the DVFS method is employed using Expression (2). When receiving a result obtainment signal supplied from the switching circuit 12, the consumption energy calculating circuit 13b outputs a result notification signal of a logic "H" when the consumption energy obtained through Expression (1) is larger than the consumption energy obtained through Expression (2), and otherwise, outputs a result notification signal of a logic "L".

Then, the consumption energy calculating circuit 13c stores in a storage unit 17c included in the consumption energy calculating circuit 13c a table including values f1, Vdd1, f2, Vdd2, WCET, and A and a table including values Ileak corresponding to various process size variation codes (PCODEs) and temperature codes (TCODEs) which will be described with reference to FIG. 14. Furthermore, the storage unit 17c included in the consumption energy calculating circuit 13c stores the code conversion tables which have been described with reference to FIGS. 3A and 3B.

Then, the consumption energy calculating circuit 13c obtains a value Ileak corresponding to a certain process size variation code and a certain temperature code as follows.

First, when an operation test of the semiconductor integrated circuit 600 according to the third embodiment is to be performed, the consumption energy calculating circuit 13c obtains a process size variation code (PCODE) using the code conversion tables described above from the temperature measurement result 44, i.e., an FCODE, obtained by operating the temperature sensor 40 while the temperature is fixed. Then, the consumption energy calculating circuit 13c stores the process size variation code (PCODE) in the storage unit 17c.

Before a task is started, the consumption energy calculating circuit 13c transmits the temperature measurement instruction 43 to the temperature sensor 40 so as to obtain the temperature measurement result 44. Then, the consumption energy calculating circuit 13c obtains a temperature code using a conversion code table corresponding to the process size variation code among the conversion code tables illustrated in FIG. 3B.

Then, the consumption energy calculating circuit 13c transmits the process condition measuring instruction 91 to the process sensor 90 so as to obtain the process condition measuring result 92. Thereafter, the consumption energy calculating circuit 13c obtains a process size variation code. Subsequently, the consumption energy calculating circuit 13c obtains a value Ileak using the table of the values Ileak corresponding to the various process size variation codes (PCODEs) and the temperature codes (TCODEs) which will be described in detail with reference to FIG. 14.

FIG. 14 is a table illustrating leakage currents (Ileak) of the circuit relative to various temperature codes and various process size variation codes which is used to calculate a consumption energy when the PG method or the DVFS method is executed. The table illustrated in FIG. 14 includes a column representing a temperature, a column representing a process size variation and a column representing a leakage current. Note that the table including the relationships among temperature codes, process size variations and values Ileak (leakage currents) of the circuit is stored in the storage unit 17c.

As described above, the semiconductor integrated circuit 600 of the third embodiment includes the process sensor 90, the temperature sensor 40, the consumption energy calculating circuit 13c, the switching circuit 12, the power-supply-voltage control circuit 50, the clock control circuit 60, and the power gating control circuit 20 which function as follows. The process sensor 90 measures a process condition in operation. The temperature sensor 40 measures a temperature in operation. The consumption energy calculating circuit 13c calculates a consumption energy of the internal circuit 11c when the PG method is employed and a consumption energy of the internal circuit 11c when the DVFS method is employed in operation under the process condition and the temperature and outputs a result of a comparison between the consumption energies. The switching circuit 12 changes a method employed for the internal circuit 11c in accordance with the comparison result. The power-supply-voltage control circuit 50 and the clock control circuit 60 change the frequency and the voltage in accordance with a signal supplied from the switching circuit 12. The power gating control circuit 20 controls connection power source to the internal circuit 11c and disconnection of the power source from the internal circuit 11c in accordance with a signal supplied from the switching circuit 12. Therefore, the semiconductor integrated circuit 600 determines a method which reduces the consumption energy of the internal circuit 11c among the DVFS method and the PG method in accordance with the element characteristic of the semiconductor integrated circuit 600 so as to select one of the methods which realizes a large reduction effect for the operation. Consequently, the consumption current of the semiconductor integrated circuit 600 is considerably reduced.

The semiconductor integrated circuit 100 according to the first embodiment includes the temperature measuring circuit which specifies a process condition in the test process and selects the PG method or the DVFS method to be employed for the internal circuit 11a in accordance with a measured temperature. On the other hand, a semiconductor integrated circuit 700 according to a fourth embodiment includes a circuit-leakage-current measuring circuit and selects a method for reducing a power consumption employed for an internal circuit in accordance with a leakage current specified by the circuit-leakage-current measuring circuit.

Figure 15:
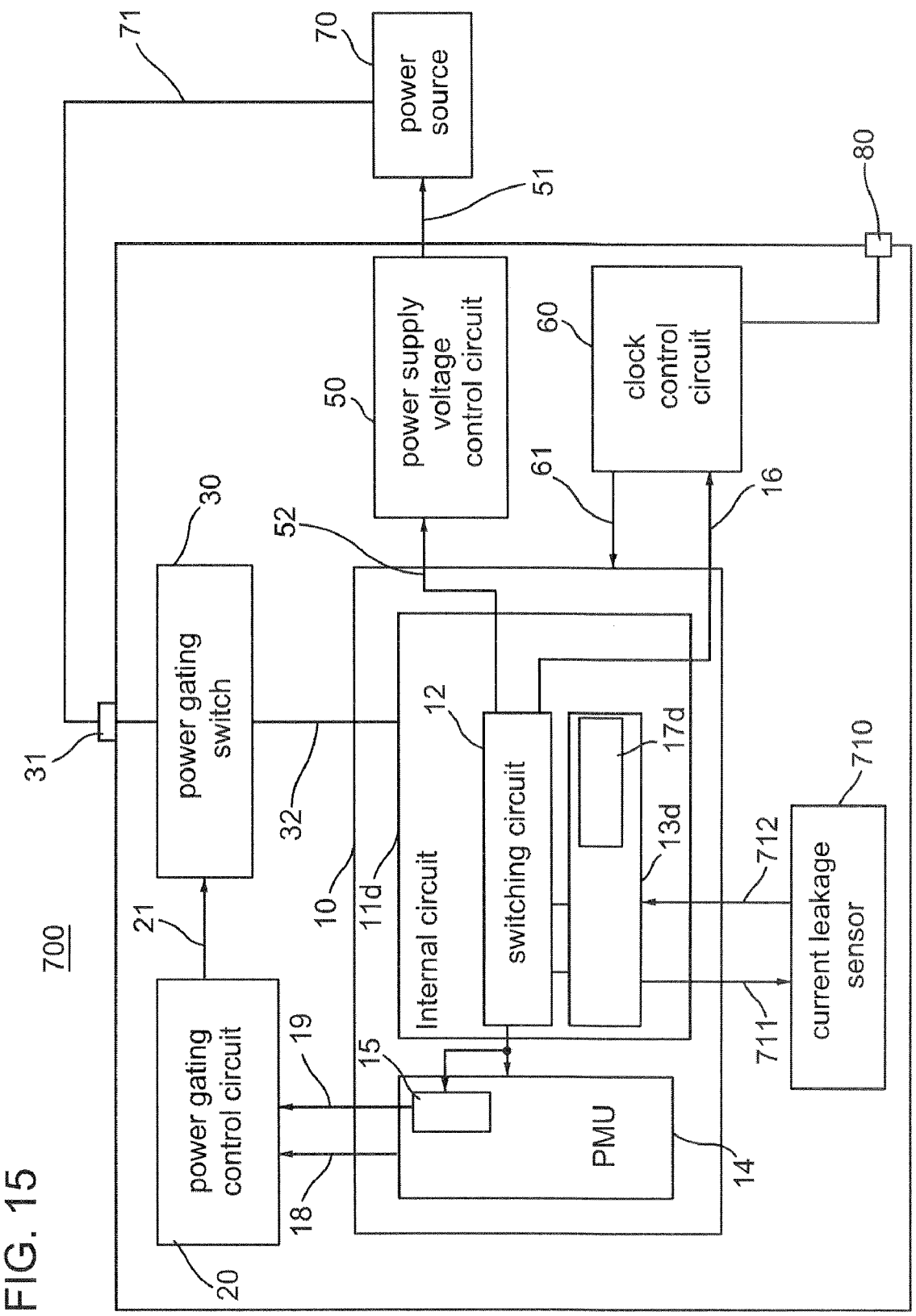
FIG. 15 illustrates a semiconductor integrated circuit and a power source according to a fourth embodiment.

FIG. 15 illustrates the semiconductor integrated circuit 700 and a power source 70 according to the fourth embodiment. The semiconductor integrated circuit 700 includes a CPU 10, a power gating control circuit 20, a power gating switch 30, a current leakage sensor 710, a power-supply-voltage control circuit 50, a clock control circuit 60, an external clock-signal terminal 80, and a power-supply terminal 31.

In the semiconductor integrated circuit 700, the power gating control circuit 20, the power gating switch 30, the power-supply-voltage control circuit 50, the clock control circuit 60, the external clock-signal terminal 80, and the power-supply terminal 31 are the same as those included in the semiconductor integrated circuit 100.

The CPU 10 includes an internal circuit 11d and a PMU 14. The PMU 14 is the same as that of the first embodiment.

The internal circuit 11d includes a switching circuit 12 and a consumption energy calculating circuit 13d. The switching circuit 12 is the same as that of the first embodiment.

The consumption energy calculating circuit 13d calculates an energy consumed by the internal circuit 11d when the PG method is employed using Expression (1). Furthermore, the consumption energy calculating circuit 13d calculates an energy consumed by the internal circuit 11d when the DVFS method is employed using Expression (2). When receiving a result obtainment signal supplied from the switching circuit 12, the consumption energy calculating circuit 13d outputs a result notification signal of a logic "H" when the consumption energy obtained through Expression (1) is larger than the consumption energy obtained through Expression (2), and otherwise, outputs a result notification signal of a logic "L".

Then, the consumption energy calculating circuit 13d stores in a storage unit 17d included in the consumption energy calculating circuit 13d a table which include values f1, Vdd1, f2, Vdd2, WCET, and A corresponding to tasks and a table including values Ileak corresponding to various current leakage codes (I-leakCODE).

Then, the consumption energy calculating circuit 13d obtains a value Ileak corresponding to a certain current leakage code (I-leakCODE) as follows.

First, the consumption energy calculating circuit 13d transmits a leakage current measuring instruction 711 to the current leakage sensor 710 so as to obtain a leakage current measuring result 712, i.e., a current leakage code (I-leakCODE) before the tasks are started.

Next, the consumption energy calculating circuit 13d obtains a value Ileak using the table including the relationships between current leakage codes (I-leakCODEs) and values Ileak.

Figure 16A:
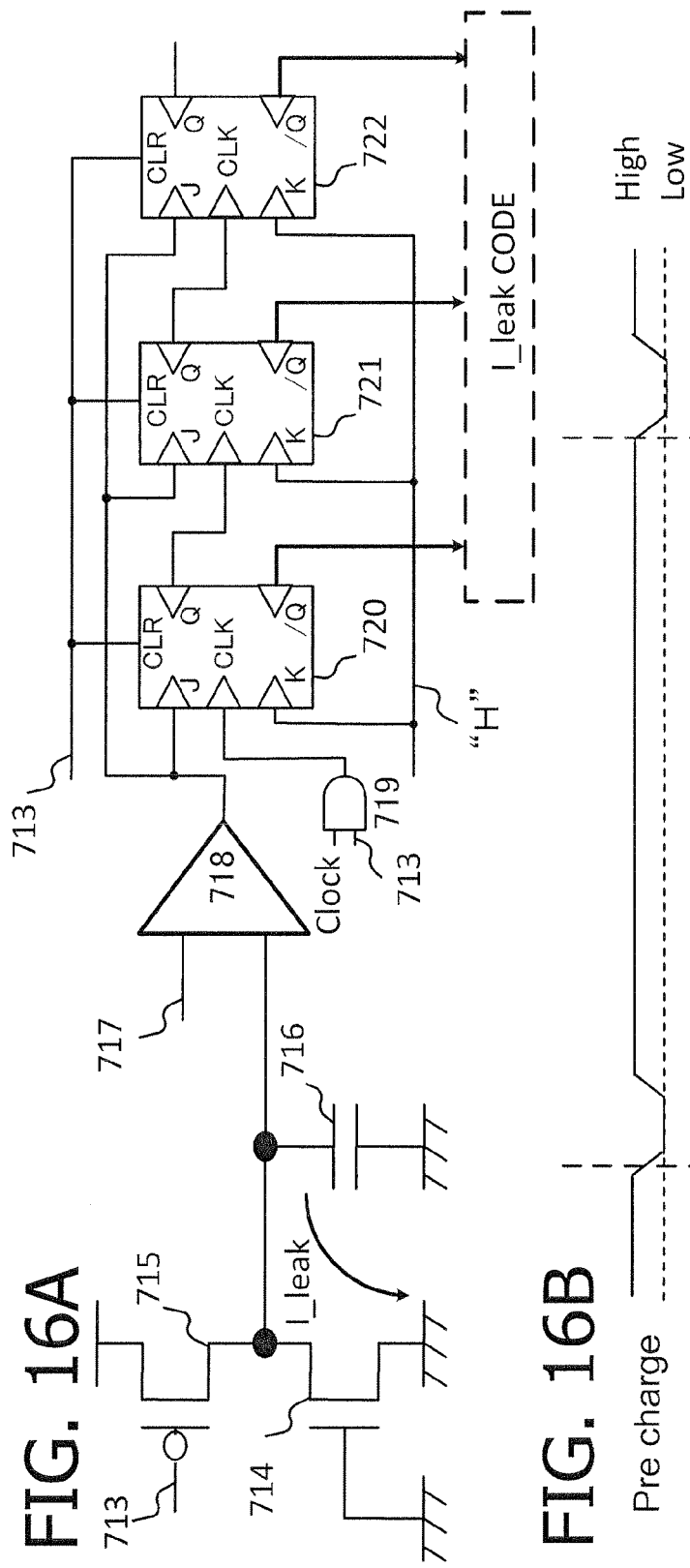
FIGS. 16A and 16B illustrate a circuit configuration of a current leakage sensor and operation waveforms of the current leakage sensor, respectively.
Figure 16B:
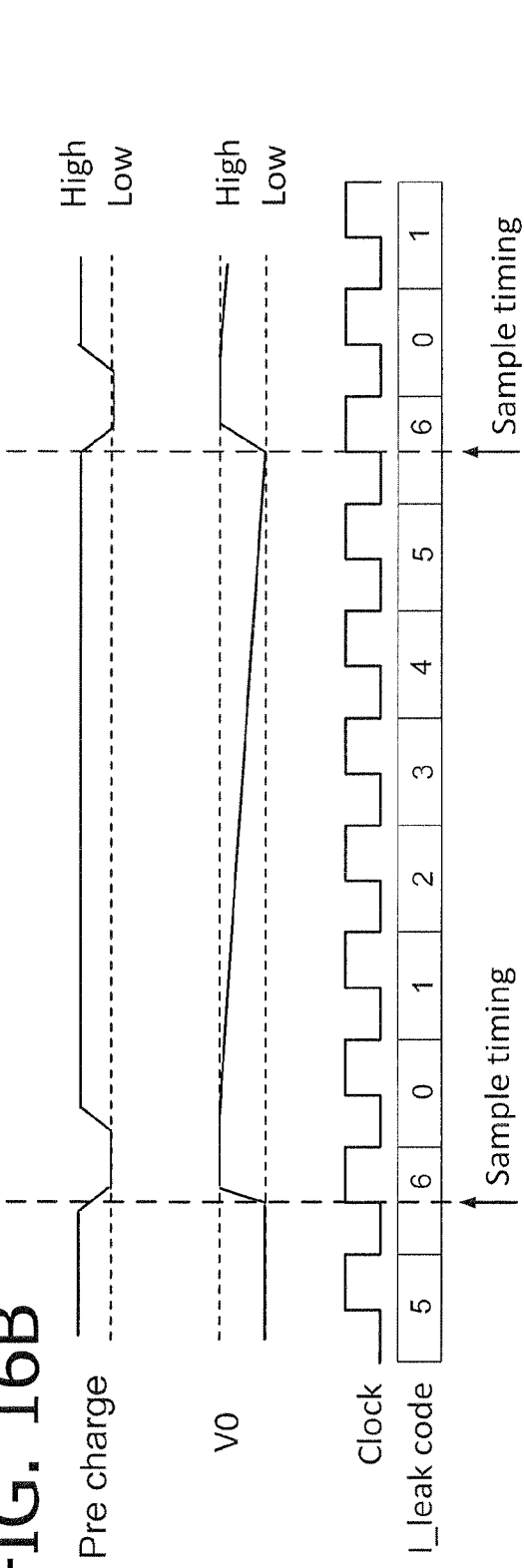

FIGS. 16A and 16B illustrate a circuit configuration of the current leakage sensor 710 and operation waveforms of the current leakage sensor 710, respectively.

The current leakage sensor 710 illustrated in FIG. 16A includes an N-type MOS transistor 714, a P-type MOS transistor 715, a capacitor 716, an operation amplifier 718, an AND circuit 719, and a 3K flip-flop circuits 720, 721, and 722.

A source and a gate of the N-type MOS transistor 714 is connected to a low-potential power source, and a drain of the N-type MOS transistor 714 is connected to one terminal of the capacitor 716, a drain of the P-type MOS transistor 715, and one input of the operation amplifier 718. A source of the P-type MOS transistor 715 is connected to a high potential power source, and a gate of the P-type MOS transistor 715 is connected to a voltage pre-charge 713.

The other terminal of the capacitor 716 is connected to the low potential power source. The other input of the operation amplifier 718 is connected to a voltage Vref 717 which maintains a fixed voltage. An output of the operation amplifier 718 is connected to J-terminals of the JK flip-flop circuits 720, 721, and 722. A clock signal is input to one input of the AND circuit 719 and the voltage pre-charge 713 is input to the other input of the AND circuit 719. An output of the AND circuit 719 is connected to a clock terminal of the JK flip-flop circuit 720. Signals of a fixed logic "H" is input to K-terminals of the JK flip-flop circuits 720, 721, and 722. A Q-terminal of the JK flip-flop circuit 720 and a clock terminal of the JK flip-flop circuit 721 are connected to each other. A Q-terminal of the JK flip-flop circuit 721 and a clock terminal of the JK flip-flop circuit 722 are connected to each other. Furthermore, /Q-terminals of the JK flip-flop circuits 720, 721, and 722 output digit signals which constitute the I-leak code.

Referring to the operation waveforms illustrated in FIG. 16B, the operation of the current leakage sensor 710 will be described. As is represented by the waveform of the voltage pre-charge 713, the voltage pre-charge 713 is fixed to a logic "H" at a time of a standby state. Therefore, one of terminals of the capacitor 716 to which the drain of the P-type MOS transistor 715 is connected has a potential of a logic "L". Accordingly, since an output of the operation amplifier 718 corresponds to a logic "L", outputs from the /Q terminals of the JK flip-flop circuits 720, 721, and 722 are fixed to a logic "L".

When the voltage pre-charge 713 becomes a logic "L" in a pulse shape in accordance with the leakage current measuring instruction 711 supplied from the consumption energy calculating circuit 13d, the P-type MOS transistor 715 is turned on and one of the terminals of the capacitor 716 corresponds to a logic "H". Then, the operation amplifier 718 outputs a signal of a logic "H". Thereafter, the voltage pre-charge 713 corresponds to a logic "H" as illustrated by a waveform VO. As a result, charge stored in the capacitor 716 is reduced owing to a leakage current of the N-type MOS transistor 714. When a potential of the one of the terminals of the capacitor 716 becomes smaller than a potential of a Vref 717, the operation amplifier 718 outputs a signal of a logic "L". Then, the JK flip-flop circuits 720, 721, and 722 count clock signals while the operation amplifier 718 outputs a signal of a logic "H" and does not perform the counting for the other period of time.

The voltage pre-charge 713 has a pulse of a logic "L" every six clocks. Then, the /Q terminals of the JK flip-flop circuits 720, 721, and 722 output an I-leak code representing a number among six clocks included in a clock period when an output of the operation amplifier 718 corresponds to a logic "L". Then, the current leakage sensor 710 outputs the I-leak code as the leakage current measuring result 712 to the consumption energy calculating circuit 13d.

As described above, the semiconductor integrated circuit 700 of the fourth embodiment includes the current leakage sensor 710, the consumption energy calculating circuit 13b, the switching circuit 12, the power-supply-voltage control circuit 50, the clock control circuit 60, and the power gating control circuit 20 which function as follows. The consumption energy calculating circuit 13d calculates a consumption energy of the internal circuit 11d when the PG method is employed and a consumption energy of the internal circuit 11d when the DVFS method is employed using the leakage current (Ileak) obtained by the current leakage sensor 710 in operation, and outputs a result of a comparison between the consumption energies. The switching circuit 12 changes a method employed for the internal circuit 11d in accordance with the comparison result. The power-supply-voltage control circuit 50 and the clock control circuit 60 change the frequency and the voltage in accordance with a signal supplied from the switching circuit 12. The power gating control circuit 20 controls connection of power source to the internal circuit 11d and disconnection of the power source from the internal circuit 11d in accordance with a signal supplied from the switching circuit 12. Therefore, the semiconductor integrated circuit 700 determines a method which reduces the consumption energy of the internal circuit 11b among the DVFS method and the PG method in accordance with an element characteristic of the semiconductor integrated circuit 700 so as to select one of the methods which realizes a large reduction effect for the operation. Consequently, the consumption current of the semiconductor integrated circuit 700 is considerably reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor integrated circuit comprising:
an internal circuit;
a detecting circuit which detects an element characteristic of the internal circuit;
a calculating circuit which calculates a first consumption energy consumed when a power gating operation is performed on a task processed by the internal circuit and a second consumption energy consumed when an operation of reducing a voltage and a frequency is performed in accordance with the element characteristic; and
a switching circuit which performs the power gating operation on the internal circuit when the first consumption energy is smaller than the second consumption energy and performs the operation of reducing a voltage and a frequency when the second consumption energy is smaller than the first consumption energy.

2. The semiconductor integrated circuit according to claim 1,
wherein the switching circuit comprises a switch which disconnects the internal circuit from a first power source when operation of the internal circuit is terminated.

3. The semiconductor integrated circuit according to claim 2,
wherein the switching circuit further comprises;
a control circuit which outputs a first control signal when the operation of the internal circuit is terminated and outputs a second control signal after a predetermined period of time has elapsed, and
a switch changing circuit which outputs a third control signal for changing a logic in accordance with the first control signal and the second control signal to the switch.

4. The semiconductor integrated circuit according to claim 1,
wherein the switching circuit further comprises;
a power-source controlling circuit which reduces a power-supply voltage of a second power source, and
a clock generating circuit which reduces a frequency of a clock signal to be supplied to the internal circuit.

5. The semiconductor integrated circuit according to claim 1,
wherein the detecting circuit detects the element characteristic derived from a temperature condition of the internal circuit.

6. The semiconductor integrated circuit according to claim 1,
wherein the detecting circuit detects the element characteristic derived from a fabrication condition of the internal circuit.

7. The semiconductor integrated circuit according to claim 1,
wherein the detecting circuit detects the element characteristic derived from a fabrication condition and a temperature condition of the internal circuit.

8. The semiconductor integrated circuit according claim 1,
wherein the element characteristic detected by the detecting circuit is an oscillation frequency of a ring oscillator including an odd number of inverters.

9. The semiconductor integrated circuit according to claim 8,
wherein the calculating circuit stores the relationship between the oscillation frequency and a current leakage amount obtained by MOS transistors included in the inverters and calculates the first and second consumption energies in accordance with the current leakage amount.

10. The semiconductor integrated circuit according to claim 1,
wherein the element characteristic detected by the detecting circuit is a current leakage characteristic of the internal circuit.

11. The semiconductor integrated circuit according to claim 1,
wherein the detecting circuit comprises;
a capacitor having a first terminal connected to a low potential power source,
a P-type MOS transistor having a drain terminal connected to a second terminal of the capacitor, a source terminal connected to a high potential power source, and a gate terminal which receives a first signal,
an N-type MOS transistor having a drain terminal connected to the second terminal of the capacitor and a source terminal and a gate terminal which are connected to the low potential power source, and
a clock counter which starts counting of a clock when receiving a clock signal and the first signal and which stops the counting of the clock when a voltage of the capacitor has reached a predetermined voltage.

12. The semiconductor integrated circuit according to claim 11,
wherein the calculating circuit calculates a current leakage amount of the N-type MOS transistor in accordance with a count value obtained from the clock counter and calculates the first and second consumption energies in accordance with the current leakage amount.

* * * * *